(12) United States Patent
Park et al.

(10) Patent No.: US 7,297,980 B2
(45) Date of Patent: Nov. 20, 2007

(54) FLAT PANEL DISPLAY DEVICE WITH POLYCRYSTALLINE SILICON THIN FILM TRANSISTOR

(75) Inventors: Ji-Yong Park, Suwon (KR); Ul-Ho Lee, Yongin (KR); Jae-Bon Koo, Yongin (KR); Ki-Yong Lee, Yongin (KR); Hye-Hyang Park, Suwon (KR)

(73) Assignee: Samsung SDI Co., Ltd., Suwon (KR)

( * ) Notice: Subject to any disclaimer, the term of this patent is extended or adjusted under 35 U.S.C. 154(b) by 33 days.

(21) Appl. No.: 10/779,781

(22) Filed: Feb. 18, 2004

(65) Prior Publication Data

US 2004/0245526 A1    Dec. 9, 2004

(30) Foreign Application Priority Data

| Jun. 5, 2003 | (KR) | 10-2003-0036519 |
| Jun. 10, 2003 | (KR) | 10-2003-0037245 |
| Jul. 25, 2003 | (KR) | 10-2003-0051659 |
| Jul. 25, 2003 | (KR) | 10-2003-0051681 |

(51) Int. Cl.
*H01L 29/04* (2006.01)
*H01L 29/786* (2006.01)

(52) U.S. Cl. .............. 257/72; 257/64; 257/E29.292

(58) Field of Classification Search .......... 257/63, 257/66, 72, 75, 64, 70, E29.273, E29.292–E29.294; 349/43
See application file for complete search history.

(56) References Cited

U.S. PATENT DOCUMENTS

| 5,614,733 | A | * | 3/1997 | Zhang et al. ............... 257/66 |
| 5,705,829 | A | * | 1/1998 | Miyanaga et al. .......... 257/66 |
| 5,744,824 | A | | 4/1998 | Kousai et al. |
| 5,932,893 | A | | 8/1999 | Miyanaga et al. |
| 6,177,301 | B1 | | 1/2001 | Jung |
| 6,479,837 | B1 | | 11/2002 | Ogowa et al. |

(Continued)

FOREIGN PATENT DOCUMENTS

JP    5107561    4/1993

(Continued)

*Primary Examiner*—Matthew C. Landau
(74) *Attorney, Agent, or Firm*—H.C. Park & Associates, PLC

(57) ABSTRACT

The present invention relates to a flat panel display device comprising a polycrystalline silicon thin film transistor and provides a flat panel display device having improved characteristics by having a different number of grain boundaries included in polycrystalline silicon thin film formed in active channel regions of a driving circuit portion and active channel regions of pixel portion. This may be achieved by having a different number of grain boundaries included in the polycrystalline silicon thin film formed in active channel regions of a switching thin film transistor and a driving thin film transistor formed in the pixel portion, and by having a different number of grain boundaries included in polycrystalline silicon thin film formed in active channel regions of a thin film transistor for driving the pixel portion for each red, green and blue of the pixel portion. Further, this may be achieved by having a different number of grain boundaries included in polycrystalline silicon formed in active channel regions of an NMOS thin film transistor and a PMOS thin film transistor for forming CMOS transistor used in flat panel display device, thereby constructing a thin film transistor to obtain the improved characteristics for each transistor.

6 Claims, 25 Drawing Sheets

U.S. PATENT DOCUMENTS

| | | | |
|---|---|---|---|
| 6,506,669 B1 | 1/2003 | Kuramasu et al. | |
| 6,521,473 B1 | 2/2003 | Jung | |
| 6,605,497 B2 | 8/2003 | Yamazaki et al. | |
| 6,692,996 B2 | 2/2004 | Lee et al. | |
| 6,727,522 B1 | 4/2004 | Kawasaki et al. | |
| 6,741,621 B2 | 5/2004 | Asano | |
| 6,759,679 B2 | 7/2004 | Lee | |
| 6,781,162 B2 | 8/2004 | Yamazaki et al. | |
| 7,037,779 B2 * | 5/2006 | Nakajima | 438/257 |
| 2003/0068836 A1 | 4/2003 | Hongo et al. | |
| 2003/0089907 A1 | 5/2003 | Yamaguchi et al. | |
| 2003/0102508 A1 | 6/2003 | Lee | |
| 2003/0193069 A1 | 10/2003 | Park et al. | |
| 2003/0235971 A1 | 12/2003 | Yamazaki et al. | |
| 2004/0004219 A1 | 1/2004 | Lee et al. | |
| 2004/0040938 A1 | 3/2004 | Yamazaki et al. | |
| 2004/0077132 A1 | 4/2004 | Lee | |
| 2004/0079944 A1 * | 4/2004 | Hiroshima et al. | 257/66 |
| 2004/0132266 A1 | 7/2004 | Yamazaki et al. | |
| 2004/0144988 A1 | 7/2004 | Jung | |
| 2004/0164300 A1 | 8/2004 | Yamazaki et al. | |
| 2005/0227130 A1 * | 10/2005 | Ahluwalia et al. | 429/20 |

FOREIGN PATENT DOCUMENTS

| | | |
|---|---|---|
| JP | 06-252398 | 9/1994 |
| JP | 2001109399 | 4/2001 |
| JP | 2001290441 | 10/2001 |
| JP | 2002-151697 | 5/2002 |
| KR | 10-2002-0094264 | 12/2002 |
| KR | 10-2003-0043292 | 6/2003 |
| KR | 2003-0059593 | 10/2003 |
| KR | 2003-0046101 | 12/2003 |

* cited by examiner

DATA LINE   GATE LINE (A)

(B)

(A)

(B)

(A)

(B)

DATA LINE      GATE LINE (A)

(B)

(A)

(B)

(A)

(B)

(A)

(B)

DATA LINE  GATE LINE (A)

(B)

FLAT PANEL DISPLAY DEVICE WITH POLYCRYSTALLINE SILICON THIN FILM TRANSISTOR

PRIORITY CLAIMS TO RELATED APPLICATIONS

This application claims the benefit of Korean Patent Application Numbers. 2003-36519, 2003-37245, 2003-51659 and 2003-51681, filed on Jun. 5, 2003, Jun. 10, 2003, Jul. 25, 2003 and Jul. 25, 2003 respectively, the disclosures of which are hereby incorporated herein by reference in their entirety.

FIELD OF THE INVENTION

The present invention relates to a flat panel display device with a polycrystalline silicon thin film transistor, and more particularly, to a flat panel display device with a polycrystalline silicon thin film transistor in which the number of grain boundaries of polycrystalline silicon formed in an active channel region of thin film transistor included in the flat panel display device varies according to the thin film transistor.

BACKGROUND OF THE INVENTION

Bonding defects such as dangling bonds existing on grain boundaries of polycrystalline silicon included in active channel region are known to function as a trap for an electric charge carrier during fabrication of a thin film transistor (hereinafter referred to as "TFT") using polycrystalline silicon.

Therefore, the size of grains, uniformity of grain size, number and position of the grains and the direction of the grains may not only have a fatal effect on TFT characteristics directly and/or indirectly, such as threshold voltage (Vth), subthreshold slope, charge carrier mobility, leakage current and device stability, but may also have a fatal effect on TFT uniformity according to position of the grains when fabricating an active matrix display substrate using TFT.

The number of fatal grain boundaries (hereinafter referred to as "primary" grain boundaries) included in the active channel regions of TFT all over the substrate of the display device can be equalized or varied according to size of grains, inclination angle θ of the grains, dimension of the active channel (length (L) and width (W)) and the position of each TFT on the substrate (see, for example, FIG. 1A and FIG. 1B).

As illustrated in FIG. 1A and FIG. 1B, the number of "primary" grain boundaries included in the active channel regions for grain size Gs, active channel dimension L×W and inclination angle θ of the grains (that is, the number of "primary" grain boundaries included in the active channel regions according to position of TFT substrate or display device) is Nmax (3 in case of FIG. 1A) or Nmax-1 (2 in case of FIG. 1B) when the maximum number of grain boundaries is Nmax. More uniformity in the TFT characteristics may be secured when the number of "primary" grain boundaries of Nmax for all TFTs is included in active channel regions. That is, the more each TFT has an equal number of grain boundaries, the more uniformity the device obtains.

On the other hand, it may be understood that uniformity is worse in characteristics of TFTs on TFT substrates or display devices if the number of TFT including Nmax "primary" grain boundaries is equal to the number of TFT including Nmax-1 "primary" grain boundaries.

Polycrystalline or single crystalline grains may be capable of forming large silicon grains on a substrate using sequential lateral solidification (SLS) crystallization technology (FIG. 2A and FIG. 2B). Characteristics similar to characteristics of TFT fabricated of single crystalline silicon may be obtained when fabricating TFT using the large silicon grains. However, a plurality of TFTs for driver and pixel array should be fabricated for an active matrix display.

For example, approximately one million pixels are made in fabricating an active matrix display having SVGA resolution. One TFT may be required in each pixel in the case of liquid crystal display (LCD). At least two or more TFTs may be required in a display using organic light emitting materials such as organic electroluminescent device.

Therefore, it may be difficult to fabricate an active matrix display by growing a certain number of grains to a certain direction only in the active channel regions of each of more than one million or two million TFTs.

A technology for converting the amorphous silicon on the whole substrate into polycrystalline silicon, or for crystallizing selected regions only on the substrate using SLS technology after depositing amorphous silicon by PECVD, LPCVD or sputtering is disclosed in U.S. Pat. No. 6,322,625 as illustrated in FIG. 2A and FIG. 2B.

The selected region is also quite a large region compared to an active channel region having dimension of several μm by several μm. Furthermore, the size of the laser beam used in crystallization technology is approximately several mm×scores of mm. Stepping and shifting of the laser beam or stage are required to crystallize the amorphous silicon of the whole region or a selected region on substrate, where misalignment exists between regions on which the laser beam is irradiated. Misalignment may be included in active channel regions of a plurality of TFTs. The number of grain boundaries vary, and TFT on the whole substrate or in the driver region or the pixel cell region may have unpredictable non-uniformity. The non-uniformity may have a fatal effect on an active matrix display device.

Fabricating TFTs for an LCD device comprising a driver and pixel array by forming large silicon grains using SLS crystallization technology is disclosed in U.S. Pat. No. 6,177,391. Barrier effects of grain boundaries for the electric charge carrier direction may be minimized, as illustrated in FIG. 3A, so that the large silicon grains obtain TFT characteristics next to those of single crystalline when the direction of the active channels is parallel to direction of grains grown by a SLS crystallization method. Many grain boundaries in which TFT characteristics function as trap of electric charge carrier, also exist such that TFT characteristics may deteriorate, as illustrated in FIG. 3B.

Practically, there are cases that a TFT inside the driver circuit and a TFT inside the pixel cell regions generally have an angle of 90° when fabricating an active matrix display, wherein uniformity of the device can be improved by fabricating the active matrix display in such a way that the direction of the active channel regions is inclined to grain growing in a direction at an angle of 30 to 60°, so that uniform characteristics between TFTs are improved and characteristics of each TFT do not greatly deteriorate (FIG. 3C).

However, it is likely that fatal grain boundaries are included in active channel regions since limited sized grains formed by SLS crystallization technology are also used in this method. Therefore, there is a problem that unpredictable non-uniformity causing a difference in characteristics between TFTs exists in this method.

On the other hand, a polycrystalline silicon thin film consists of transistors to be used as a switching device or a driving device for pixels in a flat panel display device, such as an organic electroluminescent display device or a liquid display device, wherein an active driving type active matrix organic electroluminescent display device comprises at least two thin film transistors for each sub-pixel.

An organic electroluminescent device comprises an emission layer formed of an organic matter between an anode electrode and a cathode electrode. In the organic electroluminescent device, holes injected from the anode electrode are moved to the emission layer via a hole transport layer as anode and cathode voltages are being applied to the respective electrodes. Electrons are injected into the emission layer from the cathode electrode via an electron transport layer so that the electrons and holes are reunited with each other in the emission layer to produce exitons, and light emitting materials of the emission layer are emitted to form a picture as the exitons are being changed from the excited state to the ground state. A full color organic electroluminescent display device comprises pixels emitting the colors red (R), green (G) and blue (B) in order to realize full colors.

However, the emission efficiency (Cd/A) of each emission layer of red, green and blue for emitting each color varies by color in the organic electroluminescent display device. Furthermore, it is difficult to obtain an appropriate degree of color balance, or white balance as some colors have lower luminance while other colors have higher luminance. This may occur even when an equal current is applied to the sub-pixel since luminance of the emission layer is approximately proportional to the current values applied to each sub-pixel.

For example, a corresponding amount of additional current should flow to the red and blue emission layers to adjust white balance, since the emission efficiency of the green emission layer is three to six times higher than the emission efficiency of the red emission layer and the blue emission layer.

On the other hand, a method for applying different voltages supplied through a driving line, that is, a driving voltage (Vdd) to each pixel, is disclosed in Japanese Patent Laid-open Publication No. Heisei 5-107561 as a conventional method for adjusting white balance.

Furthermore, a method for adjusting white balance by controlling the size of the driving TFT is disclosed in Japanese Patent Laid-open Publication No. 2001-109399. The amount of current flowing to respective red, green and blue organic electroluminescent devices is controlled by differently designing W/L values for each red, green and blue pixel where the channel width is W and the channel length is L in the channel regions of the driving TFT.

A method for adjusting the white balance by forming different sized pixels is disclosed in Japanese Patent Laid-open Publication No. 2001-290441. The white balance and a long life cycle may be enabled by forming the green color emitting region in such a way that the emission area of the green color emitting region having the highest emission efficiency is the smallest compared to the emission area of the red color and the blue color emitting regions. This emission efficiency difference can be enabled by the area of the anode electrode.

Additionally, one method for controlling luminance varies the voltage range applied through data lines for each red, green and blue pixel, thereby controlling the current amount.

However, the foregoing methods do not consider the crystal structure of the polycrystalline silicon in a TFT of a flat panel display device using polycrystalline silicon. Current mobility can be varied according to the crystal state of the polycrystalline silicon included in the active channel regions of TFT. Even in this case, the white balance may not be adjusted.

Furthermore, a flat panel display device is driven by generally using complementary metal oxide semiconductor thin film transistor (CMOS TFT) in constructing circuits in the flat panel display device.

However, an absolute value of the threshold voltage of a TFT is generally larger than an absolute value of the threshold voltage of a MOS transistor using a single crystalline semiconductor. Furthermore, an absolute value of the threshold voltage of an N type thin film transistor is quite different from an absolute value of the threshold of a P type thin film transistor. For example, if the threshold voltage of the N type thin film transistor is 2 V, the threshold of the P type thin film transistor may be −4 V.

Therefore, a great threshold voltage absolute value difference between the P type thin film transistor and N type thin film transistor may not be desirable in operating circuits, and it may function as a barrier in reducing the driving voltage. For example, typically, a P type thin film transistor having a large threshold voltage absolute value not properly operated at a lower driving voltage.

That is, the P type thin film transistor generally functions only as a passive element, such as a resistor, and is not operated fast enough. It may be necessary to increase the driving voltage to operate the P type thin film transistor just as a passive element.

Particularly, a difference in the work function between the gate electrode and the intrinsic silicon semiconductor may be decreased as much as −0.6 eV in the case where the gate electrode is formed of a material having a work function of 5 eV or less, such as aluminum. Consequently, the threshold voltage of the P type thin film transistor is shifted to a negative value while threshold voltage of the N type thin film transistor approaches a zero voltage. Therefore, the N type thin film transistor generally becomes the on-state.

In the above state, it is desirable that the threshold voltage absolute value of the N type thin film transistor be almost equal to that of the P type thin film transistor. The threshold voltage has been controlled by doping N type or P type impurities at a very low concentration of $10^{18}$ atoms/cm$^3$ or less. That is, the threshold voltage has been controlled to about 0.1 V or less by doping impurities having a concentration of $10^{15}$ to $10^{18}$ atoms/cm$^3$.

However, a shift of the threshold voltage may not observed even if impurities are added to the semiconductor in a concentration of $10^{18}$ atoms/cm$^3$ or less when using a semiconductor that is not a single crystalline semiconductor. Furthermore, the threshold voltage is rapidly changed, and the conductivity becomes p-type or n-type if the concentration of impurities is $10^{18}$ atoms/cm$^3$ or more, since the polycrystalline silicon has many defects. The added impurities are trapped and can not be activated by the defects since the defect concentration is $10^{18}$ atoms/cm$^3$. Furthermore, the concentration of the impurities is larger than the concentration of the defects, excess impurities are activated, and the conductive type is changed to n or p type.

In order to solve these problems, the length of the channels is varied so that the channel length of a P type thin film transistor is shorter than that of an N type thin film transistor, such as described in U.S. Pat. Nos. 6,492,268, 6,124,603 and 5,615,935. However, these patents also have problems in that the manufacturing process is complicated, since the channels are manufactured in such a way that length of the channels is different.

SUMMARY OF THE INVENTION

Therefore, in order to solve the foregoing problems of the prior art, it is an object of the present invention to provide a flat panel display device comprising thin film transistor using polycrystalline silicon capable of satisfying TFT characteristics of a driving circuit portion and TFT characteristics of a pixel portion when forming polycrystalline silicon.

Furthermore, it is another object to provide a flat panel display device comprising a thin film transistor using polycrystalline silicon capable of satisfying characteristics of a driving thin film transistor and a switching thin film transistor positioned at a pixel portion when forming the polycrystalline silicon thin film.

Furthermore, it is another object to provide a CMOS thin film transistor in which the threshold voltage absolute value of a P type thin film transistor is substantially the same as that of an N type thin film transistor, and which has a high current mobility by controlling the number of grains as equally maintaining length of channels.

Furthermore, it is another object to provide a flat panel display device in which white balance is adjusted. Appropriate luminance is obtained by supplying the optimum current to each sub-pixel. The life cycle is not shortened when the same driving voltage is applied to the driving TFT without changing of size of the active channels of driving TFT.

In order to achieve the foregoing object, the present invention provides a flat panel display device with a polycrystalline silicon thin film transistor comprising a pixel portion divided into gate lines and data lines and equipped with a thin film transistor driven by signals applied to the gate lines and data lines. A driving circuit portion comprises one or more thin film transistors connected to the gate lines and the data lines respectively, to apply signals to the pixel portion, wherein the average number of grain boundaries of the polycrystalline silicon, which are formed in the active channel regions of the thin film transistor installed at the driving circuit portion and meet the current direction line, is at least one or more less than the average number of grain boundaries of the polycrystalline silicon which are formed in active channel regions of thin film transistor installed at the pixel portion and meet the current direction line for a unit area of active channels.

Furthermore, the present invention provides a flat panel display device with polycrystalline silicon thin film transistor comprising a switching thin film transistor for transmitting data signals and a driving thin film transistor for driving the organic electroluminescent device, so that a certain amount of current flows through organic electroluminescent device according to the data signals. The average number of grain boundaries of the polycrystalline silicon which are formed in active channel regions of the driving thin film transistor and meet a current direction line is at least one or more greater than the average number of grain boundaries of polycrystalline silicon which are formed in active channel regions of the switching thin film transistor and meet a current direction line for a unit area of active channels.

Furthermore, the present invention provides a CMOS thin film transistor characterized in that a P type thin film transistor and an N type thin film transistor have a different number of primary grain boundaries of polycrystalline silicon included in an active channel regions. The number of grain boundaries included in the P thin film transistor is at least one or more less than the number of grain boundaries included in the N type thin film transistor.

Furthermore, the present invention provides a flat panel display device comprising green, red and blue pixel regions, and a driving thin film transistor for driving the pixels having the same length and width of active channels, wherein the number of grain boundaries of polycrystalline silicon included in active channel regions of a driving thin film transistor is different from each other for each pixel.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Figure 1A:
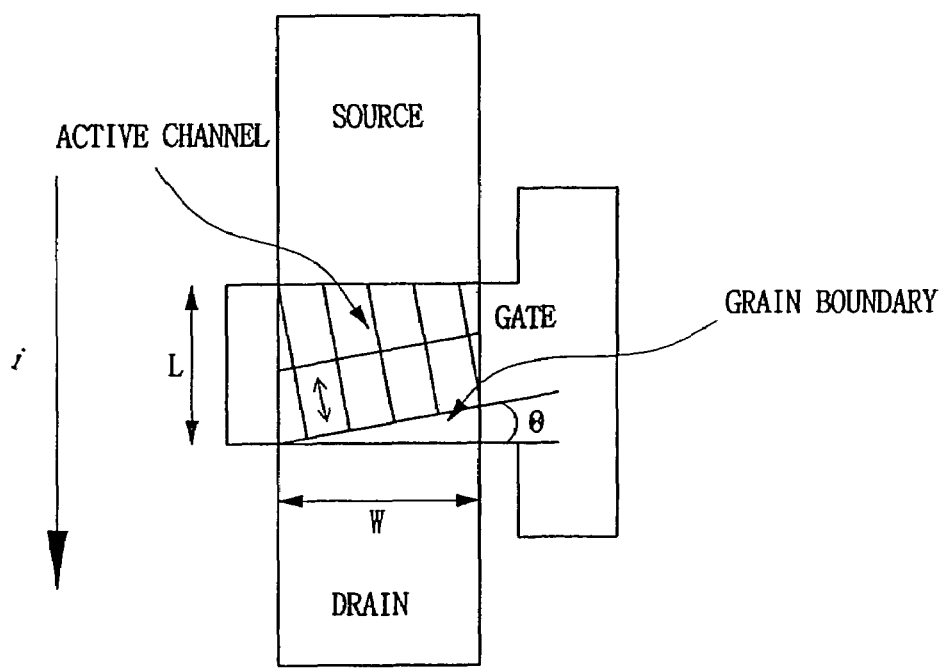
FIG. 1A is a schematic cross sectional view illustrating TFT in which the number of fatal grain boundaries is 2 for equal grain size Gs and active channel dimension L>W according to an embodiment of the invention.
Figure 1B:
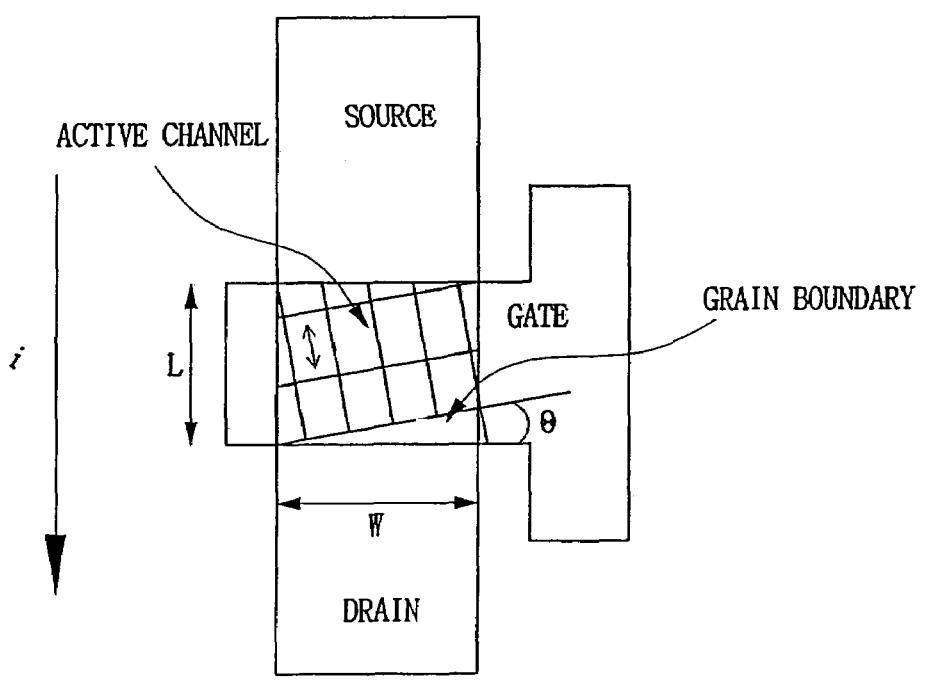
FIG. 1B is a schematic cross sectional view illustrating TFT in which the number of fatal grain boundaries is 3 for the equal grain size Gs and active channel dimension L>W according to an embodiment of the invention.
Figure 2A:
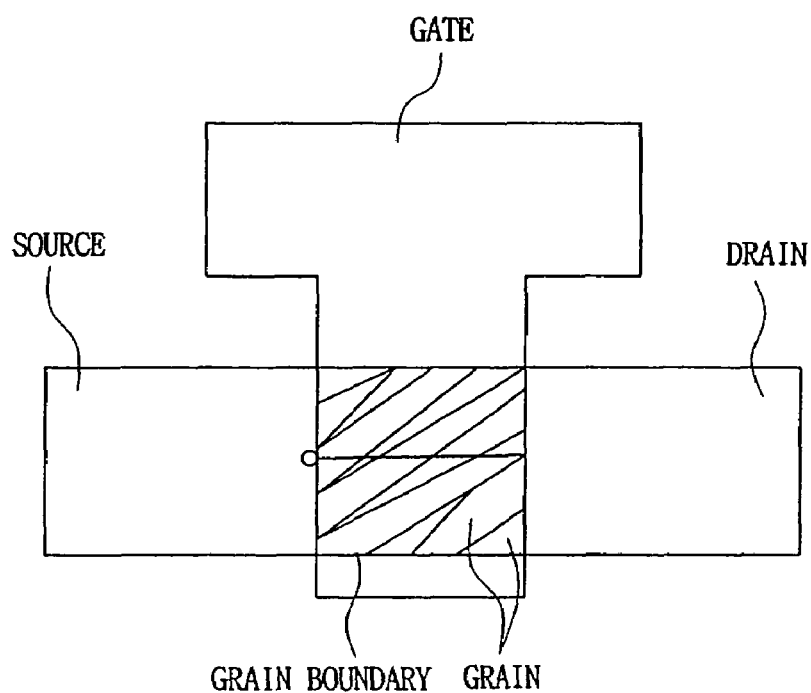
FIG. 2A and FIG. 2B are schematic cross sectional views illustrating active channels of a TFT comprising silicon grains in which size of grains formed by a SLS crystallization method is large according to an embodiment of the invention.
Figure 2B:
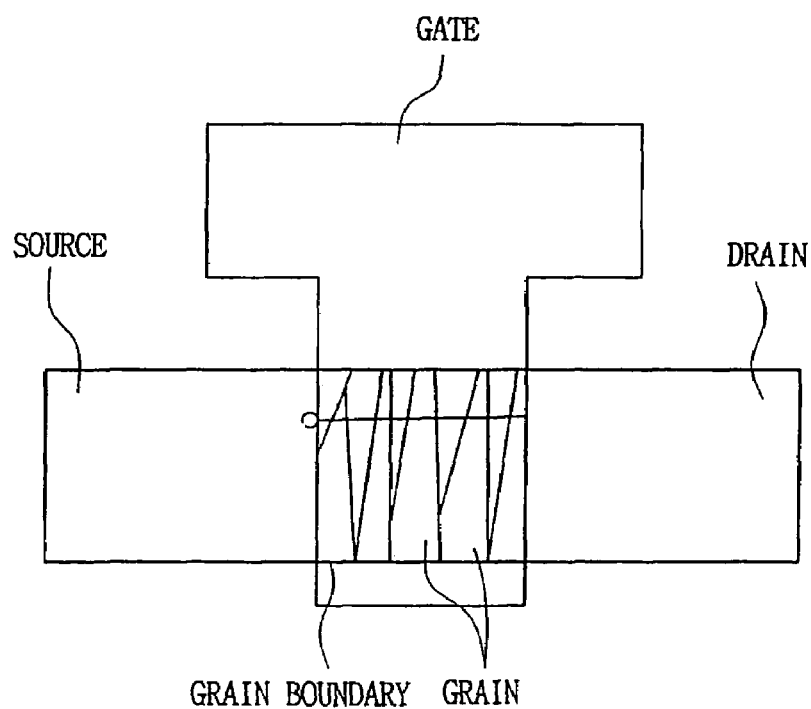
Figure 3A:
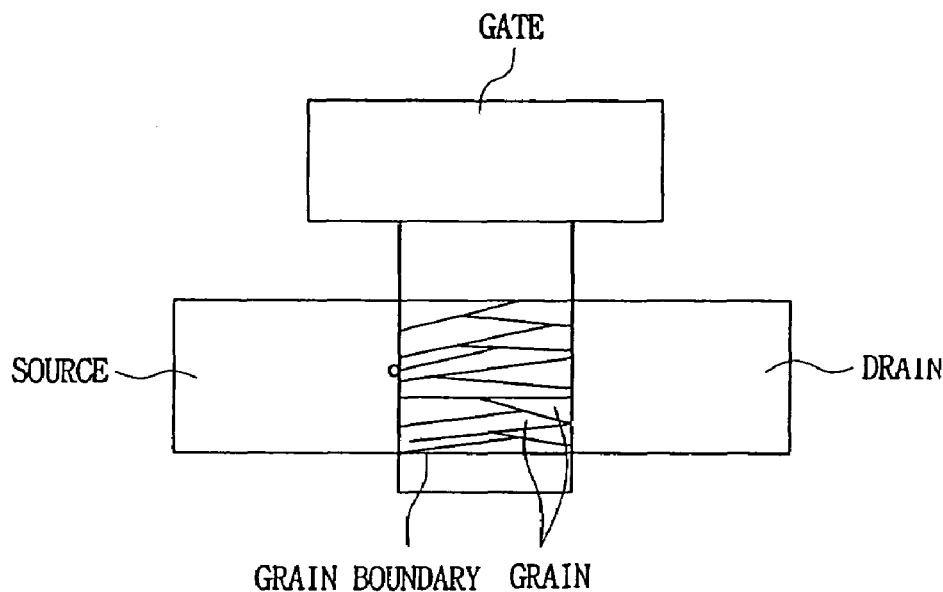
FIG. 3A to FIG. 3C are schematic cross sectional views illustrating active channels of another TFT fabricated according to the prior art.
Figure 3B:
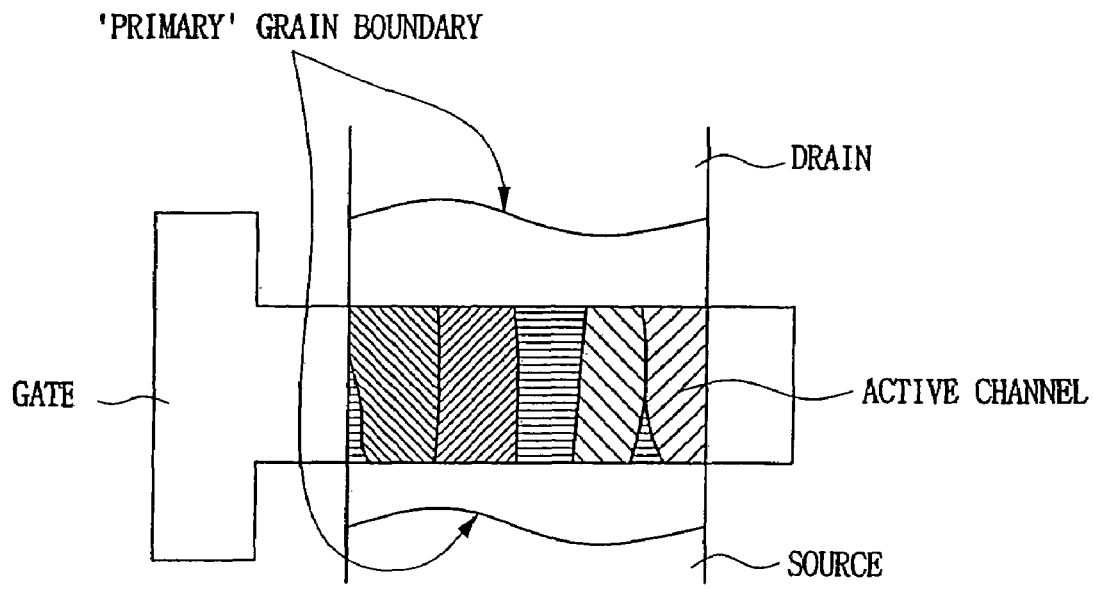
Figure 3C:
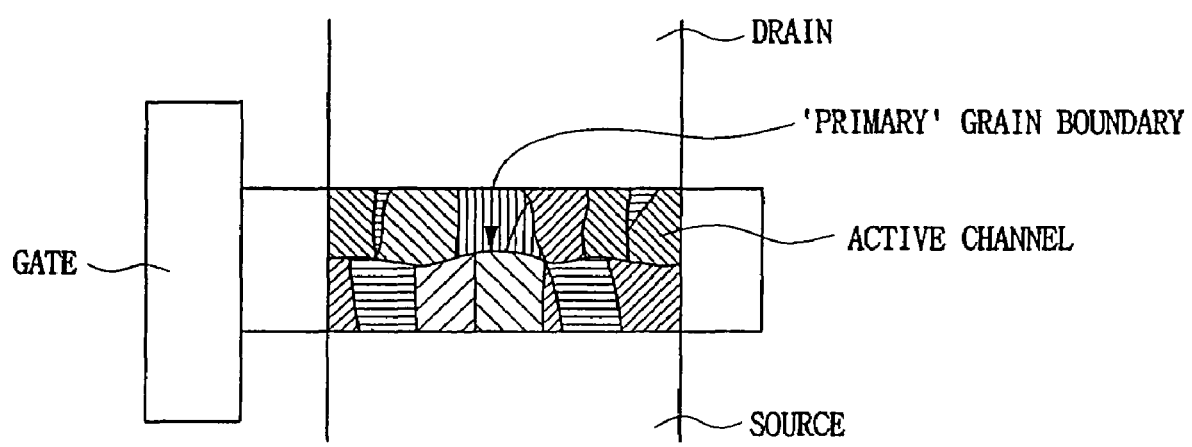

The present invention will now be described in detail in connection with exemplary embodiments with reference to the accompanying drawings. For reference, like reference characters designate corresponding portions throughout several views.

Grain boundaries are generated between neighboring grains due to the limited size of the grains if grains of polycrystalline silicon having an effect, either directly or indirectly, on TFT characteristics are enlarged and regularized to improve TFT characteristics when fabricating a TFT for an active matrix display.

In the present invention, "grain size" is said to be a confirmable distance between grain boundaries and defined as the distance between the grain boundaries belonging to an ordinary error range.

Particularly, when the grain boundaries exist in active channel regions, the grain boundaries may have a fatal effect on TFT characteristics. This may result from limitations in the process of forming a polycrystalline silicon thin film.

Furthermore, the number of grain boundaries included in active channel regions of a TFT comprising a driving thin film transistor and a switching thin film transistor fabricated on a display substrate may vary based on the size and direction of the grains and the dimension of active channels. Therefore, characteristics of a TFT and a fabricated display become non-uniform, and the TFT and display may not be driven.

Accordingly, the present invention provides a flat panel display device comprising a TFT controlled by electrical characteristics by changing the number of grain boundaries existing in active channel regions of each TFT for respective thin film transistors fabricated on the substrate of driving circuit portion and pixel portion.

Figure 4:
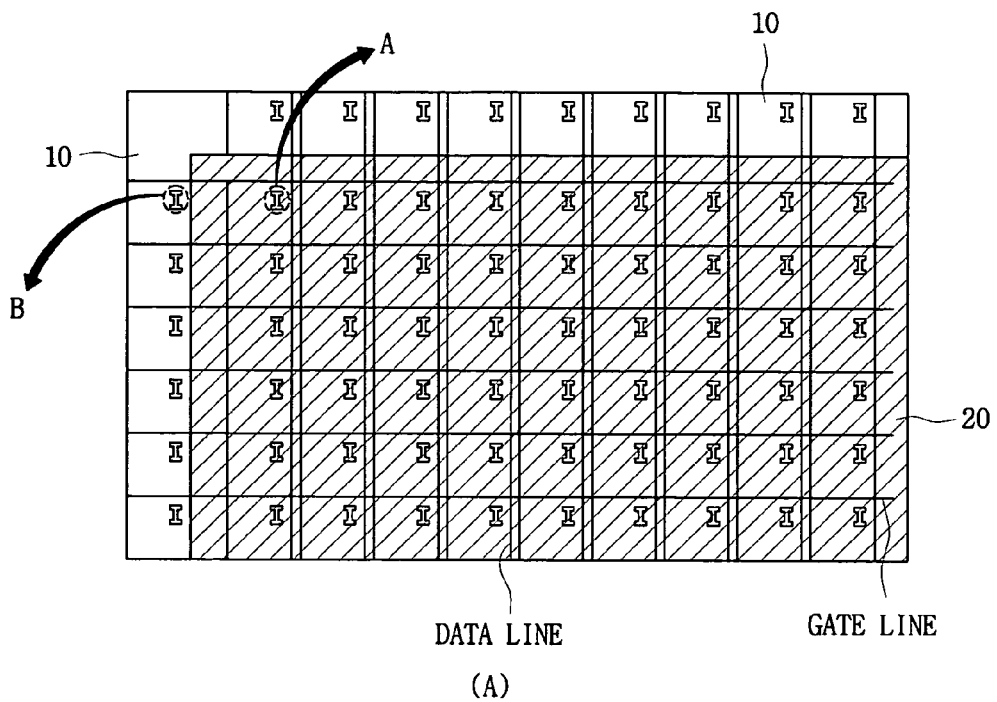
FIG. 4 illustrates polycrystalline silicon grains formed in active channel regions of a thin film transistor formed in a pixel portion and a driving circuit portion in an organic electroluminescent device according to an embodiment of the present invention, wherein enlarged view A shows a thin film transistor of the pixel portion, and enlarged view B shows a thin film transistor of the driving circuit portion.
Figure 4:
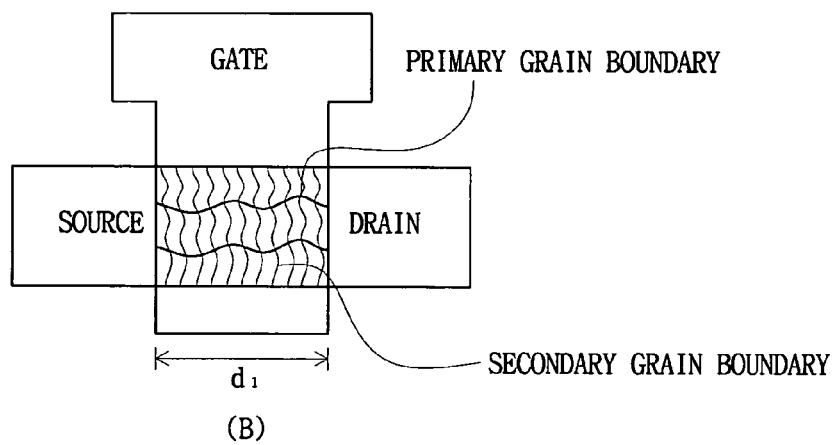
Figure 4:
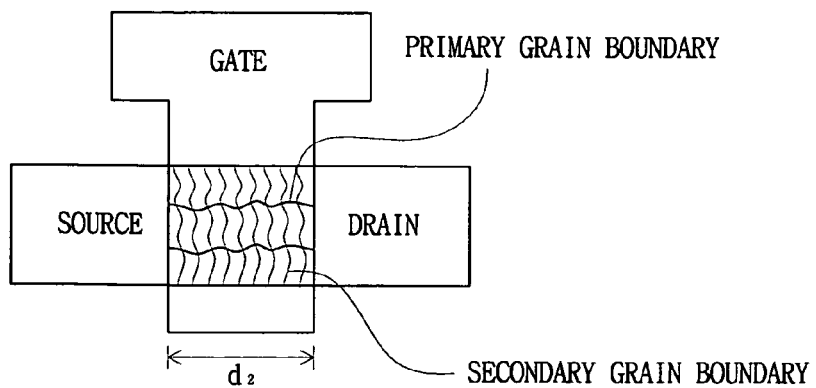

FIG. 4 illustrates polycrystalline silicon grains formed in active channel regions of a thin film transistor formed in a pixel portion and a driving circuit portion in an organic electroluminescent device according to an embodiment of the present invention, wherein enlarged view A shows a thin film transistor of the pixel portion, and enlarged view B shows a thin film transistor of the driving circuit portion.

Referring to FIG. 4, an organic electroluminescent device according to an embodiment of the present invention is divided into gate lines and data lines and comprises a pixel portion 20 comprising thin film transistors driven by signals applied to the gate lines and data lines. A driving circuit portion 10 comprises one or more thin film transistors respectively connected to the gate lines and data lines to apply signals to the pixel portion 20.

The average number of grain boundaries of polycrystalline silicon which are formed in active channel regions of a thin film transistor installed at the driving circuit portion 10 and which meet the current direction line is at least one or more less than the average number of grain boundaries of polycrystalline silicon which are formed in active channel regions of a thin film transistor installed at the pixel portion 20 and meet the current direction line for a unit area of active channels.

The shape of the grains of polycrystalline silicon is anisotropic, and the grains of polycrystalline silicon are preferably formed by one of a sequential lateral solidification (SLS) method and a metal induced lateral crystallization (MILC) method. Although grain boundaries of polycrystalline silicon formed by a SLS method include "primary" grain boundaries ordinarily perpendicularly formed to growing direction of grains and "side" grain boundaries of anisotropic grains ordinarily perpendicularly formed to the "primary" grain boundaries, grain boundaries of a type which is not specified hereinafter represent "primary" grain boundaries, since grain boundaries having a primary effect on electrical characteristics of a thin film transistor mean "primary" grain boundaries. Grain boundaries having an incidental effect on electrical characteristics of a thin film transistor mean "side" grain boundaries of anisotropic grains.

On the other hand, referring to enlarged views A and B, the primary grain boundaries of polycrystalline silicon formed in active channel regions of a thin film transistor installed at driving circuit portion 10 and pixel portion 20 may be inclined to a current direction line at an angle of −45 to 45° and further may be inclined to the current direction line at an angle of 0 (zero)°.

Furthermore, the pixel portion 20 may achieve greater uniformity than the driving circuit portion 10 by lengthening length $d_1$ of active channels of the thin film transistor installed at the pixel portion 20 more than length $d_2$ of active channels of the thin film transistor installed at the driving circuit portion 10 so that more side grain boundaries of anisotropic grains are included in the pixel portion 20 than the driving circuit portion 10. This may result in a reduction of current change according to a change in the number of grain boundaries meeting the current direction line.

Figure 5:
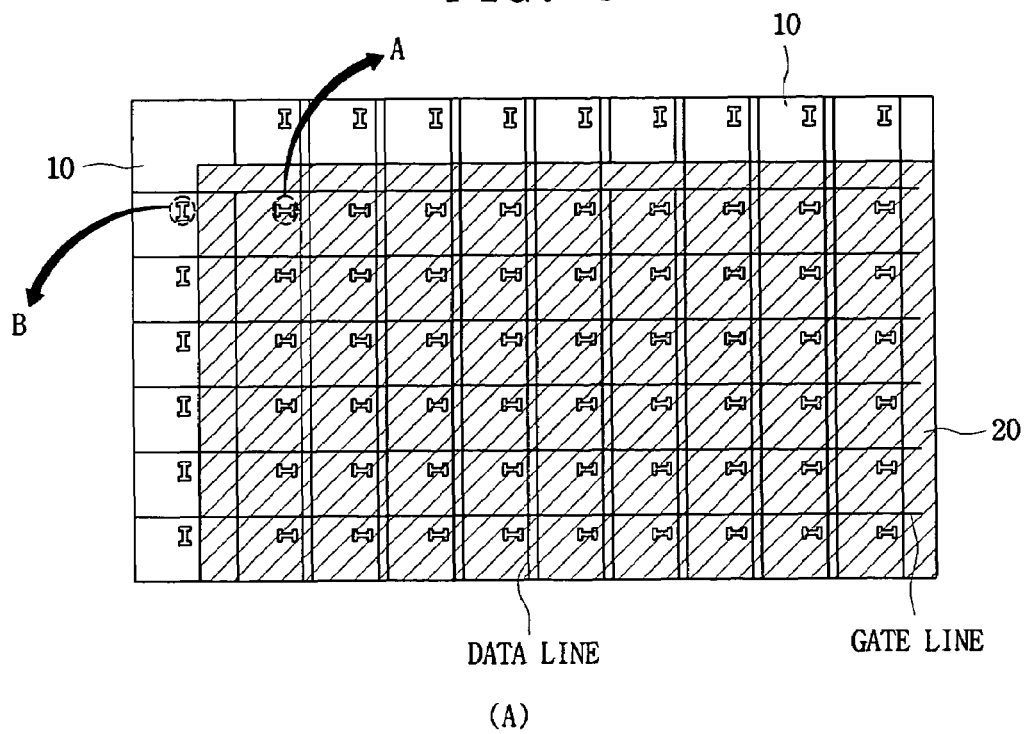
FIG. 5 illustrates polycrystalline silicon grains formed in active channel regions of a thin film transistor formed in a pixel portion and a driving circuit portion in an organic electroluminescent device according to an embodiment of the present invention, wherein enlarged view A shows a thin film transistor of the pixel portion, and enlarged view B shows thin film transistor of the driving circuit portion.
Figure 5:
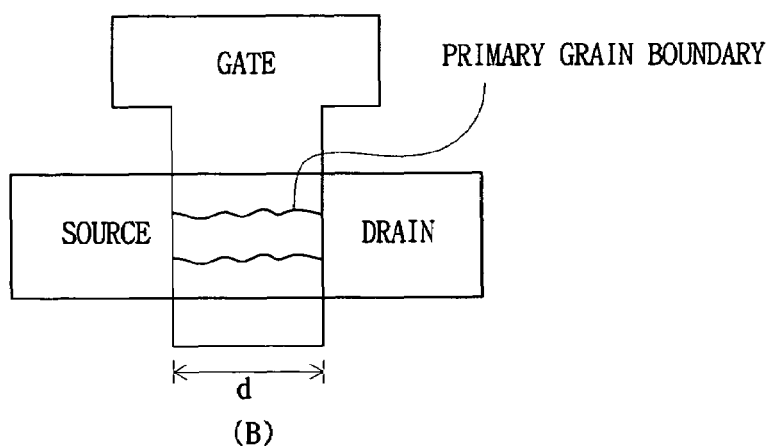
Figure 5:
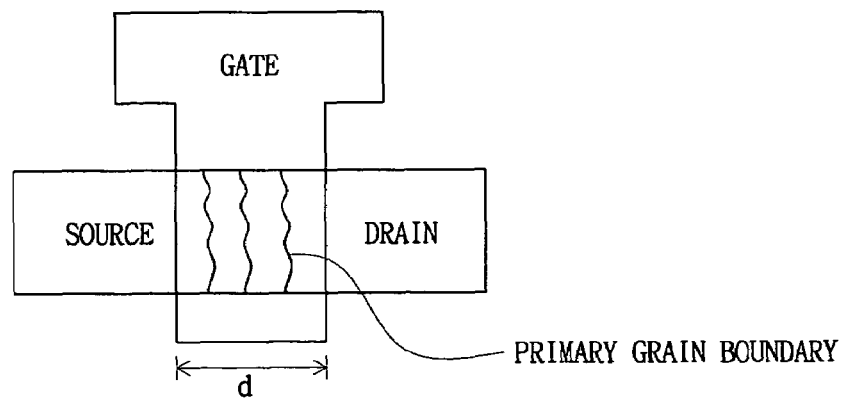

FIG. 5 illustrates polycrystalline silicon grains formed in active channel regions of a thin film transistor formed in pixel portion 20 and driving circuit portion 10 in an organic electroluminescent device according to an embodiment of the present invention. Enlarged view A shows a thin film transistor of the pixel portion, and enlarged view B shows a thin film transistor of the driving circuit portion.

In this embodiment, primary grain boundaries may be inclined to current direction line at an angle of −45 to 45°, and the primary grain boundaries further may be inclined horizontally to the current direction line in the pixel portion 20 as illustrated in the enlarged view A, so that the number of primary grain boundaries of polycrystalline silicon formed in active channel regions of a thin film transistor of driving circuit portion 10 to meet a current direction line is one or more less than the number of primary grain boundaries of polycrystalline silicon formed in active channel regions of a thin film transistor of pixel portion 20 to meet a current direction line. On the other hand, the primary grain boundaries may be inclined to a current direction line at an angle of 45 to 135°. The primary grain boundaries further may be inclined perpendicularly to the current direction line in the driving circuit portion 10.

The active channel regions of a thin film transistor of the driving circuit portion 10 and pixel portion 20 may have an equal length of d.

Figure 6:
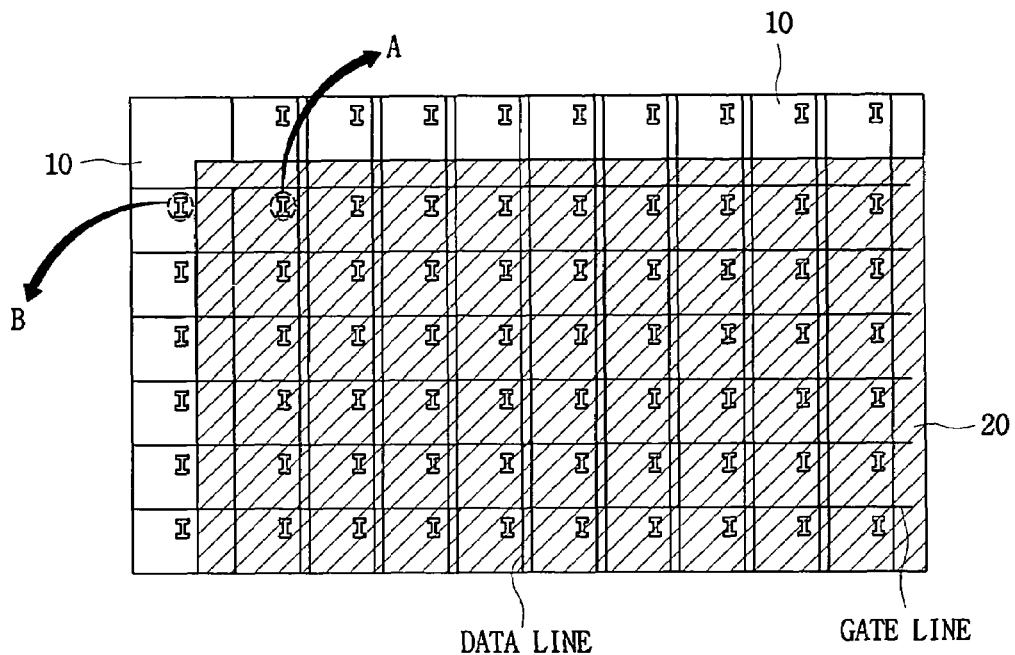
FIG. 6 illustrates polycrystalline silicon grains formed in active channel regions of a thin film transistor formed in a pixel portion and a driving circuit portion in an organic electroluminescent device according to an embodiment of the present invention, wherein enlarged view A shows a thin film transistor of the pixel portion, and enlarged view B shows a thin film transistor of the driving circuit portion.
Figure 6:
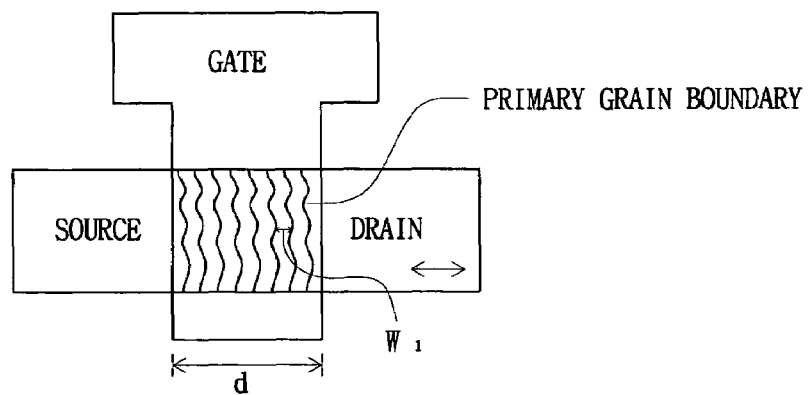
Figure 6:
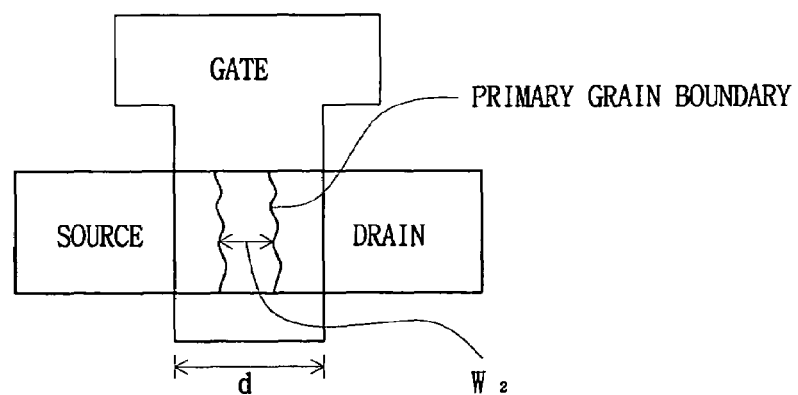

FIG. 6 illustrates polycrystalline silicon grains formed in active channel regions of a thin film transistor formed in pixel portion 20 and driving circuit portion 10 in an organic electroluminescent device according to an embodiment of the present invention. Enlarged view A shows a thin film transistor of the pixel portion, and enlarged view B shows a thin film transistor of the driving circuit portion.

Referring to FIG. 6, the grain boundaries of polycrystalline silicon formed in active channel regions of a thin film transistor installed at the driving circuit portion 10 may be inclined to a current direction line at an angle of −45 to 45°, and, further may be arranged that the grain boundaries are parallel to the current direction line.

Furthermore, the grain boundaries of polycrystalline silicon formed in active channel regions of a thin film transistor installed at the pixel portion 20 are inclined to a current direction line at an angle of −45 to 45°, and may be arranged that the grain boundaries are parallel to the current direction line, wherein active channels of a thin film transistor installed at the pixel portion 20 and active channels of a thin film transistor installed at the driving circuit portion 10 have an equal length of d.

However, in this case, distance $w_1$ between primary grain boundaries in the pixel portion is shorter than distance $w_2$ between primary grain boundaries in the driving circuit portion since uniformity in the pixel portion is secured when the number of primary grain boundaries meeting a current direction line included in active channel regions of a thin film transistor of the pixel portion 20 is larger than the number of primary grain boundaries meeting a current direction line included in active channel regions of a thin film transistor of the driving circuit portion 10.

Figure 7:
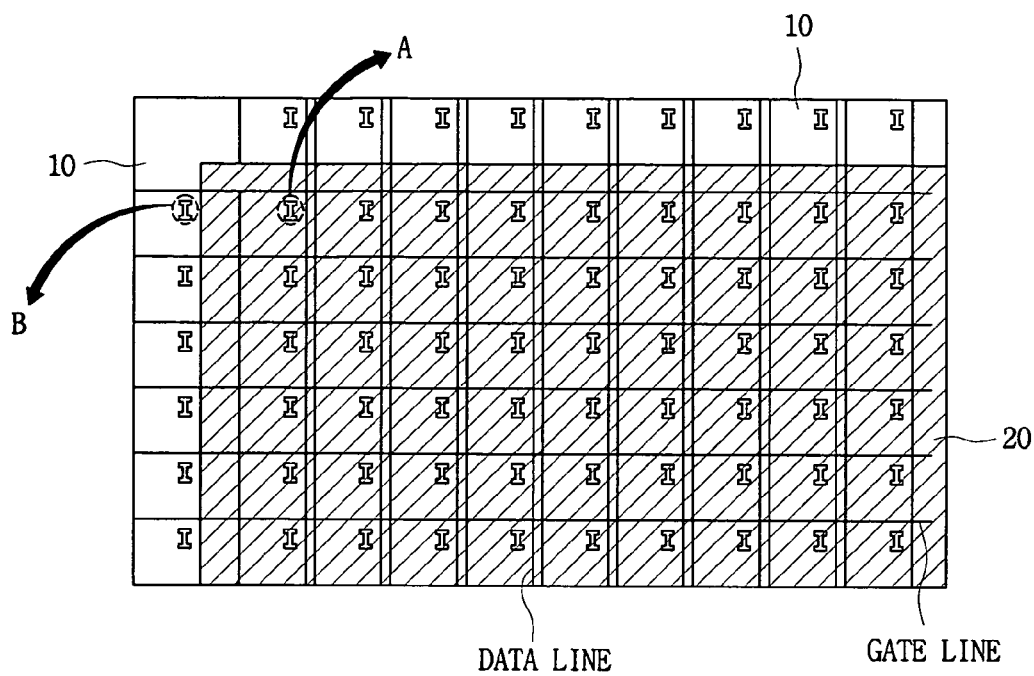
FIG. 7 illustrates polycrystalline silicon grains formed in active channel regions of a thin film transistor formed in a pixel portion and a driving circuit portion in an organic electroluminescent device according to an embodiment of the present invention, wherein enlarged view A shows a thin film transistor of the pixel portion, and enlarged view B shows a thin film transistor of the driving circuit portion.
Figure 7:
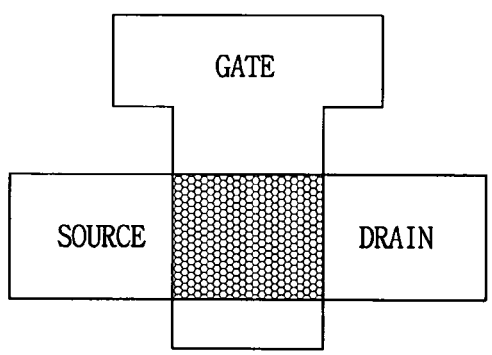
Figure 7:
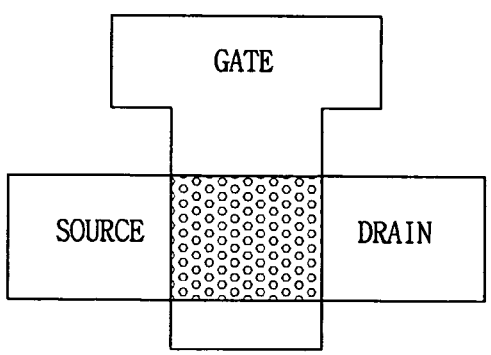

FIG. 7 illustrates polycrystalline silicon grains formed in active channel regions of thin film transistors formed in pixel portion and driving circuit portion in an organic electroluminescent device according to an embodiment of the present invention. Enlarged view A shows a thin film transistor of the pixel portion, and enlarged view B shows thin film transistor of the driving circuit portion.

Referring to FIG. 7, grains of polycrystalline silicon formed in active channel regions of a thin film transistor of driving circuit portion 10 and pixel portion 20 are formed in an isotropic shape. More grain boundaries are included in a thin film transistor at the pixel portion than in a thin film transistor at the driving circuit portion if the size of the grains of polycrystalline silicon formed in the pixel portion illustrated in enlarged view A is larger than the size of the grains of polycrystalline silicon formed in the driving circuit portion illustrated in enlarged view B. Therefore, more grain boundaries meeting a current direction line are included in a thin film transistor at the pixel portion than in a thin film transistor at the driving circuit portion. The number of grain boundaries in the pixel portion may be at least one or more larger than the number of grain boundaries in the driving circuit portion, wherein the driving circuit portion and pixel portion of active channel regions of a thin film transistor have an equal length d.

Isotropic shaped polycrystalline silicon in this embodiment may be formed by excimer laser annealing.

Figure 8:
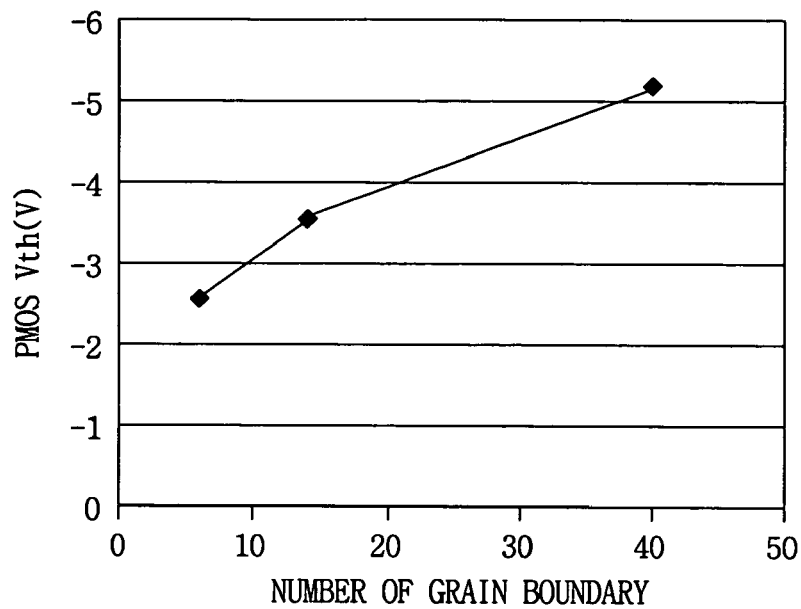
FIG. 8 is a graph illustrating a change in threshold voltage values according to the number of grain boundaries included in active channel regions of a thin film transistor according to an embodiment of the invention.
Figure 9:
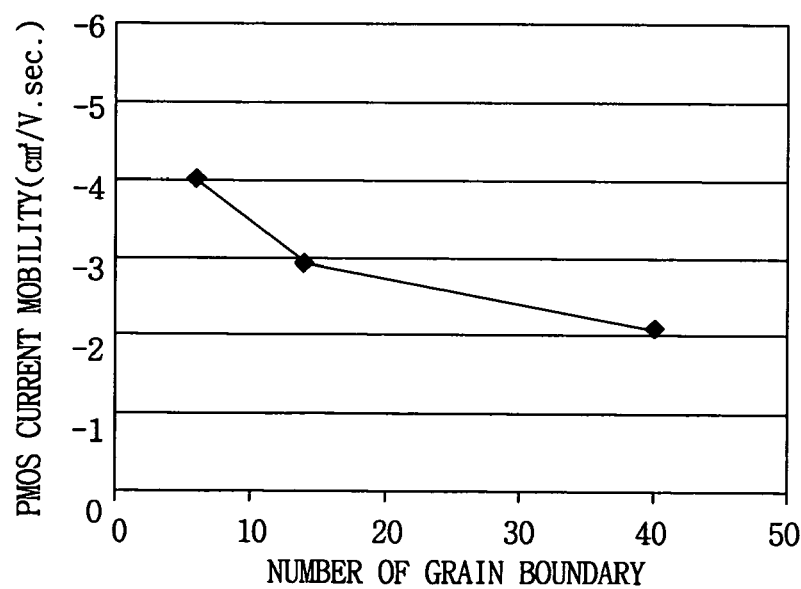
FIG. 9 is a graph illustrating a change in current mobility values according to the number of grain boundaries included in active channel regions of a thin film transistor according to an embodiment of the invention.

FIG. 8 is a graph illustrating changes in threshold voltage values according to the number of grain boundaries included in active channel regions of a thin film transistor. FIG. 9 is a graph illustrating changes in current mobility values according to the number of grain boundaries included in active channel regions of a thin film transistor.

Referring to FIG. 8 and FIG. 9, it can be seen that threshold voltage is increased, and current mobility is decreased, as the number of grain boundaries meeting a current direction line is increased.

The grain boundaries may have an effect on electrical characteristics of thin film transistor, wherein the electrical characteristics of a thin film transistor are influenced mainly by primary grain boundaries and additionally by side grain boundaries of anisotropic grains.

If the fabricated polycrystalline silicon is applied to a TFT with one or more gates, the average number of grains included in an area of equal active channel regions may be at least one or more larger in a pixel portion than in a driving circuit portion, and the number of grain boundaries included may also be larger in the pixel portion than in the driving circuit portion.

Furthermore, in active channel regions of a gate included in one TFT, the size of polycrystalline silicon grains formed in active channel regions of the pixel portion may be more uniformized than the size of polycrystalline silicon grains formed in active channel regions of the driving circuit portion. The difference in the number (area) of grain boundaries due to a difference in the number of grains existing in active channels may be decreased as the area of grain boundaries covering the one grain is decreased while the number (area) of grain boundaries included in active channels is increased when the size of the grains is small.

Furthermore, the average grain size of polycrystalline silicon grains included in active channel regions of each gate may be larger in the driving circuit portion than in the pixel portion.

Therefore, uniformity of current may be better in the pixel portion than in the driving circuit portion, as grain size is more uniform in the pixel portion than in the driving circuit portion, although current characteristics such as current mobility may be better in the driving circuit portion than in the pixel portion.

In the present invention, a TFT has two or more gates.

A flat panel display device comprising the above formed polycrystalline silicon thin film may be an organic electroluminescent device or liquid crystal display device.

Figure 10:
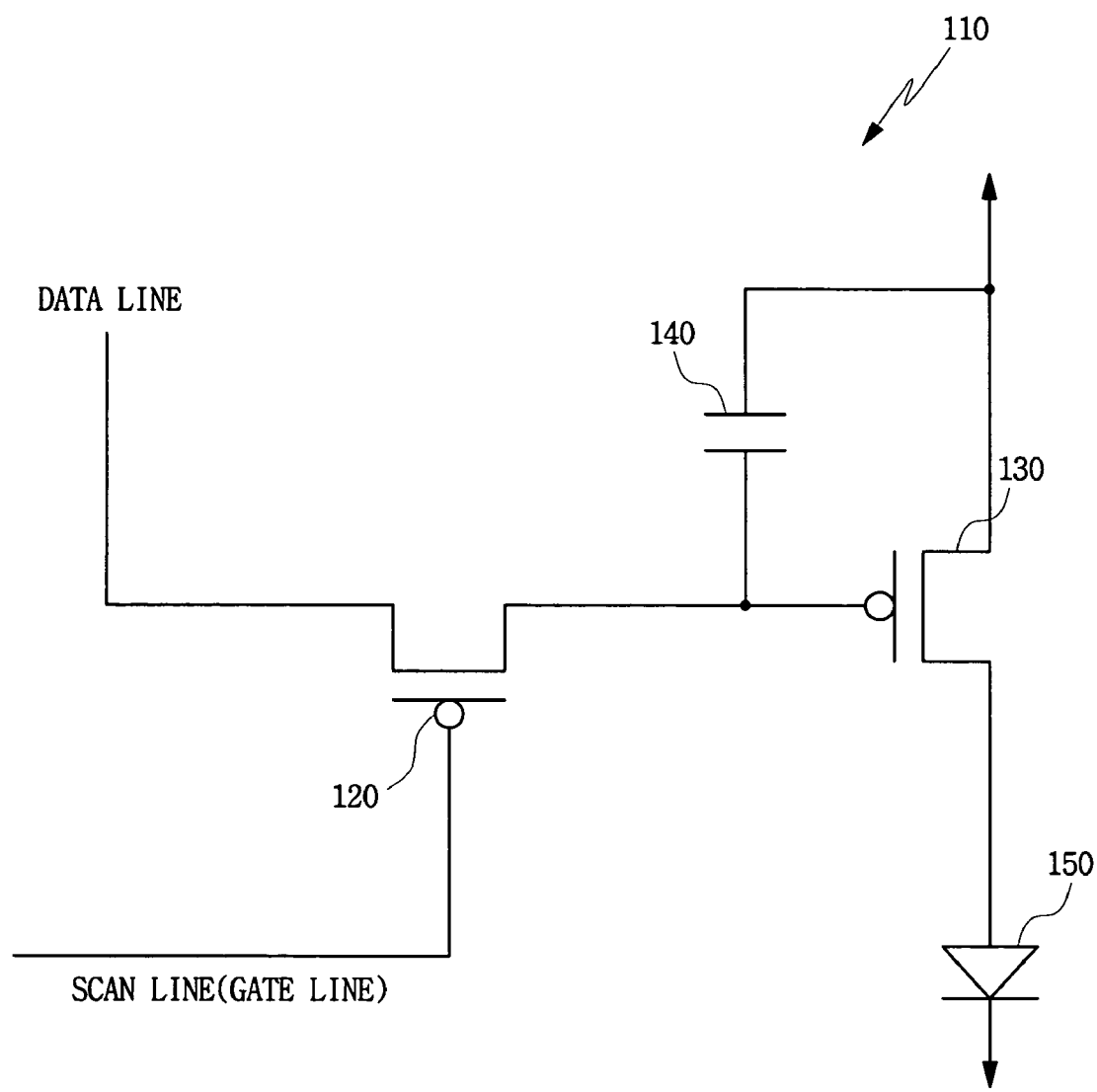
FIG. 10 is an equivalent circuit drawing for one unit pixel in pixel portion of an organic electroluminescent display device according to an embodiment of the present invention.

FIG. 10 is an equivalent circuit drawing for one unit pixel in a pixel portion 20 of an organic electroluminescent display device according to an embodiment of the present invention. Referring to FIG. 10, each unit pixel 110 of an ordinary organic electroluminescent display device comprises two P type thin film transistors used as a switching thin film transistor 120 and driving thin film transistor 130, as well as a capacitor 140, and an organic electroluminescent (EL) device 150.

The switching thin film transistor 120 is driven by scan signals applied to gate lines which control transmission of data signals applied to data lines. The driving thin film transistor 130 determines the amount of current flowing through the EL device 150 based on the data signals transmitted through the switching thin film transistor 120, (e.g., by voltage difference (Vgs) between the gate and the source). The capacitor 140 stores the data signals transmitted through the switching thin film transistor 120 for a period of one frame.

Figure 11:
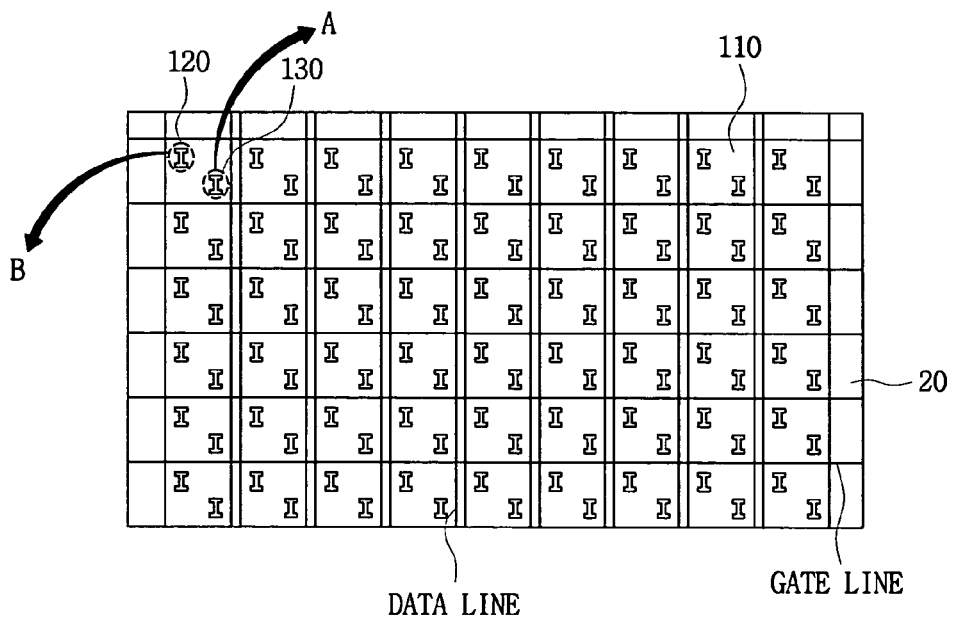
FIG. 11 illustrates an arrangement of a thin film transistor formed in a driving thin film transistor and a switching thin film transistor in a pixel portion of an organic electroluminescent display device according to an embodiment of the present invention, wherein enlarged view A shows an arrangement of polycrystalline silicon grains formed in active channel regions of the driving thin film transistor, and enlarged view B shows an arrangement of polycrystalline silicon grains formed in active channel regions of the switching thin film transistor.
Figure 11:
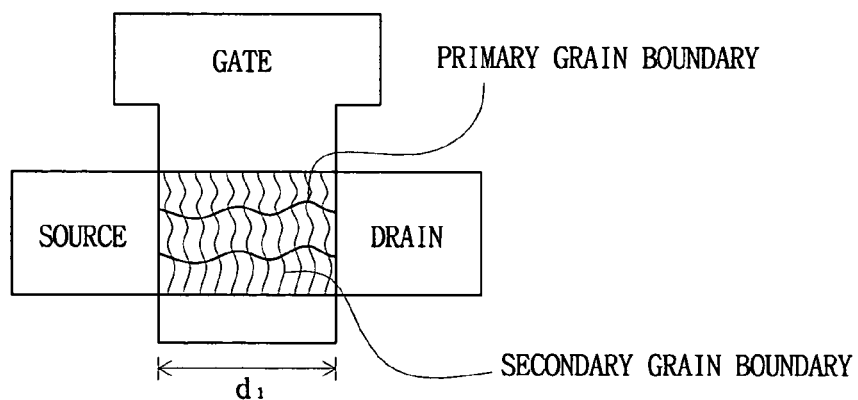
Figure 11:
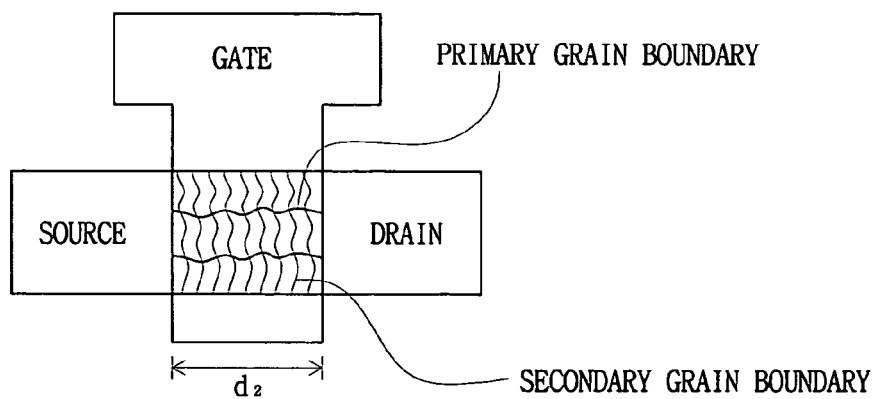

FIG. 11 illustrates an arrangement of thin film transistor formed in driving thin film transistor 130 and a switching thin film transistor 120 in a pixel portion 20 of an organic electroluminescent display device according to an embodiment of the present invention. Enlarged view A shows an arrangement of polycrystalline silicon grains formed in active channel regions of the driving thin film transistor, and enlarged view B shows an arrangement of polycrystalline silicon grains formed in active channel regions of the switching thin film transistor.

Referring to FIG. 11, an organic electroluminescent device may be divided into gate lines and data lines and includes a switching thin film transistor 120 for transmitting data signals, and a driving thin film transistor 130 for driving the organic electroluminescent device so that a certain amount of current flows through the organic electroluminescent device according to the data signals.

The average number of grain boundaries of polycrystalline silicon which are formed in active channel regions of the switching thin film transistor and meet the current direction line may be at least one or more greater than the average number of grain boundaries of polycrystalline silicon which are formed in active channel regions of the driving thin film transistor and meet the current direction line for a unit area of active channels. The shape of the grains of polycrystalline silicon is anisotropic, and the polycrystalline silicon is preferably fabricated by an SLS method.

Referring to enlarged views A and B, primary grain boundaries of the polycrystalline silicon formed in active channel regions of the switching thin film transistor and the driving thin film transistor may be arranged in such a way that the primary grain boundaries are inclined to the current direction line at an angle of −45 to 45°, preferably at an angle of 0 (zero)°.

Furthermore, improved uniformity may be obtained in the driving thin film transistor compared to the switching thin film transistor by lengthening length $d_1$ of active channels of the driving thin film transistor compared to length $d_2$ of active channels of the switching thin film transistor so that more side grain boundaries of anisotropic grains are included in the driving thin film transistor than in the switching thin film transistor. This may reduce the change of current based on the change of the number of grain boundaries meeting the current direction line.

Figure 12:
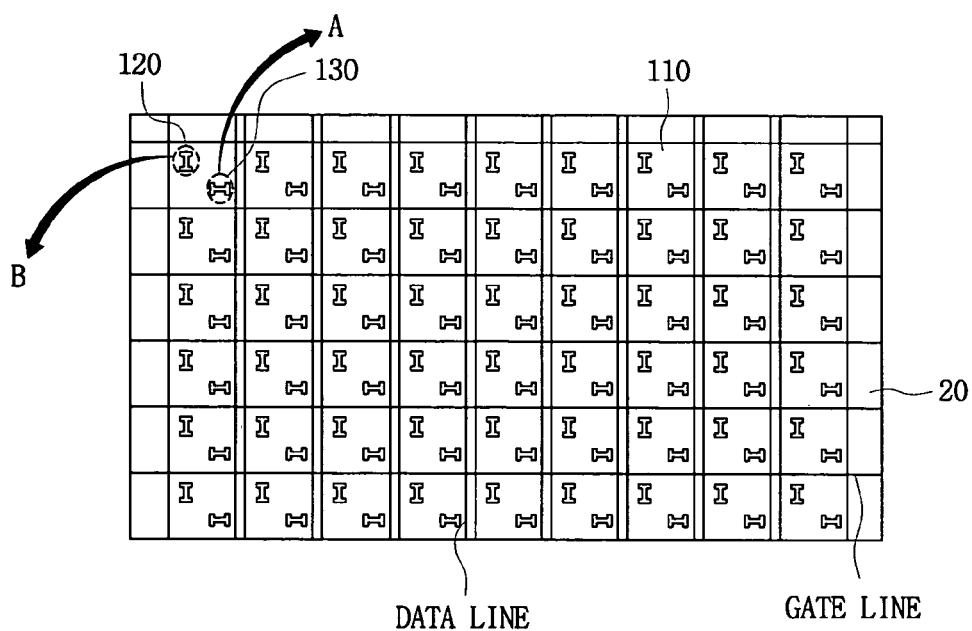
FIG. 12 illustrates an arrangement of switching and driving thin film transistors in a pixel portion of an organic electroluminescent device according to an embodiment of the present invention, wherein enlarged view A shows an arrangement of polycrystalline silicon grains formed in active channel regions of a driving thin film transistor, and enlarged view B shows an arrangement of polycrystalline silicon grains formed in active channel regions of a switching thin film transistor.
Figure 12:
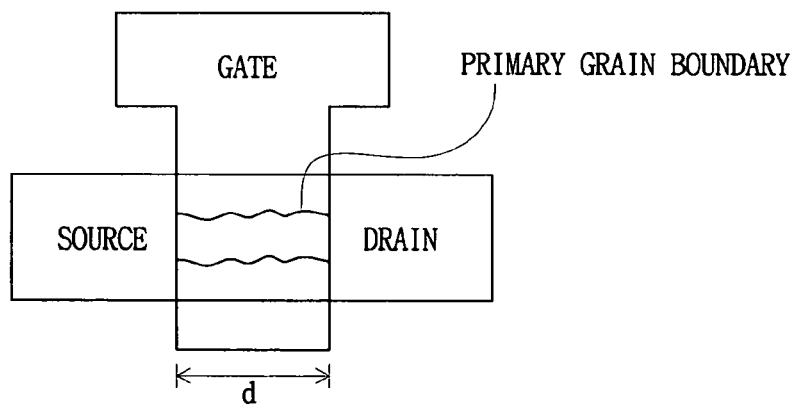
Figure 12:
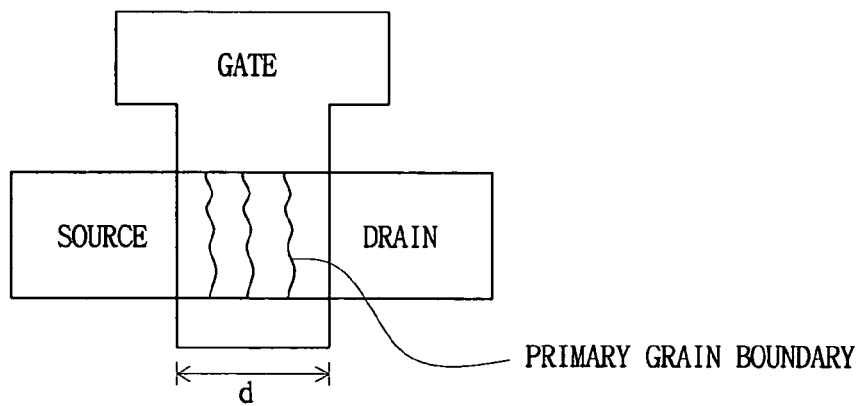

FIG. 12 illustrates an arrangement of a switching thin film transistor 120 and a driving thin film transistor 130 in pixel portion 20 of an organic electroluminescent device according to an embodiment of the present invention. Enlarged view A shows an arrangement of polycrystalline silicon grains formed in active channel regions of a driving thin film transistor, and enlarged view B shows an arrangement of polycrystalline silicon grains formed in active channel regions of a switching thin film transistor.

In this embodiment, primary grain boundaries in the driving thin film transistor may be inclined to the current direction line at an angle of −45 to 45°, and further may be inclined horizontally to the current direction line as illustrated in the enlarged view A. The number of primary grain boundaries of polycrystalline silicon which are formed in active channel regions of the switching thin film transistor and meet the current direction line may be one or more greater than the number of primary grain boundaries of polycrystalline silicon which are formed in active channel regions of the driving thin film transistor and meet the current direction line. Primary grain boundaries in the switching thin film transistor may be inclined to the current direction line at an angle of 45 to 135°, and further may be inclined perpendicularly to the current direction line, wherein the active channel regions of the switching thin film transistor and the driving thin film transistor have an equal length d.

Figure 13:
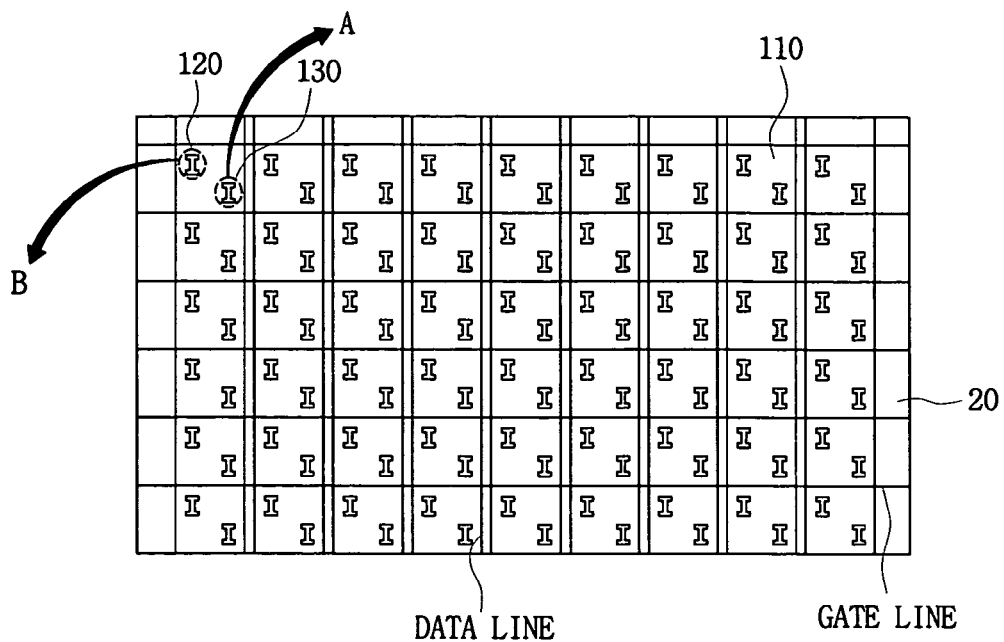
FIG. 13 illustrates an arrangement of switching and driving thin film transistors in a pixel portion of an organic electroluminescent device according to an embodiment of the present invention, wherein enlarged view A shows an arrangement of polycrystalline silicon grains formed in active channel regions of a driving thin film transistor, and enlarged view B shows an arrangement of polycrystalline silicon grains formed in active channel regions of a switching thin film transistor.
Figure 13:
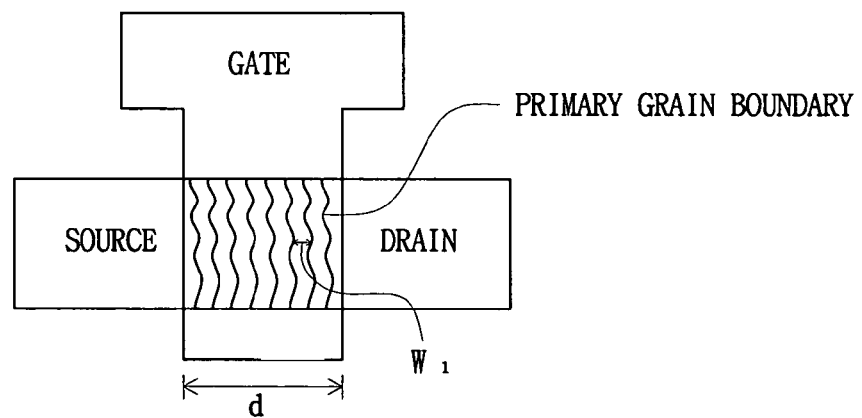
Figure 13:
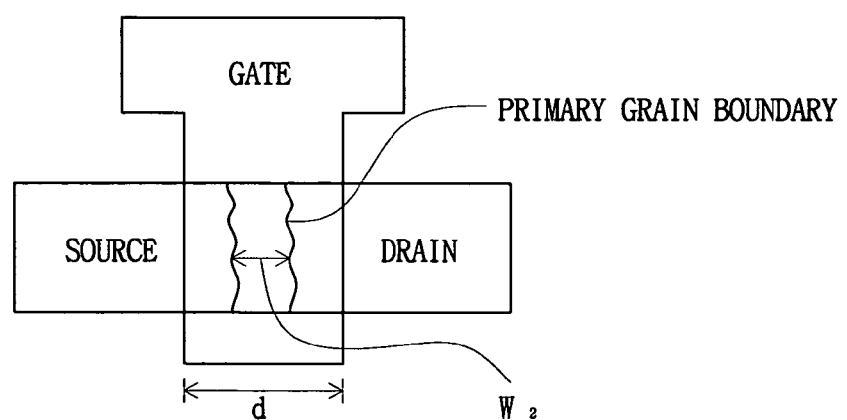

FIG. 13 illustrates an arrangement of a switching thin film transistor 120 and a driving thin film transistor 130 in pixel portion 20 of an organic electroluminescent device according to an embodiment of the present invention. Enlarged view A shows an arrangement of polycrystalline silicon grains formed in active channel regions of a driving thin film transistor, and enlarged view B shows an arrangement of polycrystalline silicon grains formed in active channel regions of a switching thin film transistor.

Referring to FIG. 13, the polycrystalline silicon grain boundaries formed in active channel regions of the switching thin film transistor may be arranged in such a way that the polycrystalline silicon grain boundaries are inclined to the current direction line at an angle of −45 to 45°, and further may be inclined parallel to the current direction line.

Furthermore, the polycrystalline silicon grain boundaries formed in active channel regions of the driving thin film transistor may be arranged in such a way that the polycrystalline silicon grain boundaries are inclined to the current direction line at an angle of −45 to 45°, and further may be inclined parallel to the current direction line, and active channels of the driving thin film transistor and the switching thin film transistor have an equal length d.

However, in this case, distance $w_1$ between primary grain boundaries in the driving thin film transistor may be shorter than distance $w_2$ between primary grain boundaries in the switching thin film transistor since uniformity in the driving thin film transistor may be obtained when the number of primary grain boundaries meeting a current direction line included in active channel regions of the driving thin film transistor is larger than the number of primary grain boundaries meeting a current direction line included in active channel regions of the switching thin film transistor.

Figure 14:
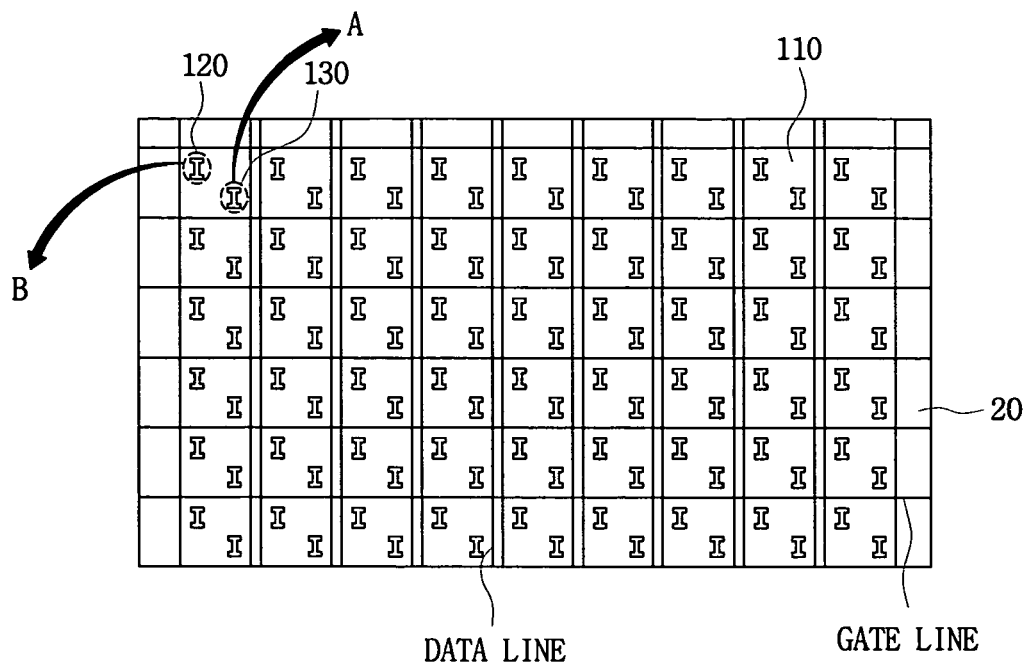
FIG. 14 illustrates an arrangement of switching and driving thin film transistors in a pixel portion of an organic electroluminescent device according to an embodiment of the present invention, wherein enlarged view A shows an arrangement of polycrystalline silicon grains formed in active channel regions of a driving thin film transistor, and enlarged view B shows an arrangement of polycrystalline silicon grains formed in active channel regions of a switching thin film transistor.
Figure 14:
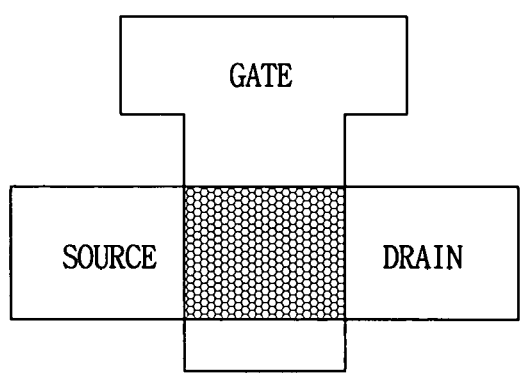
Figure 14:
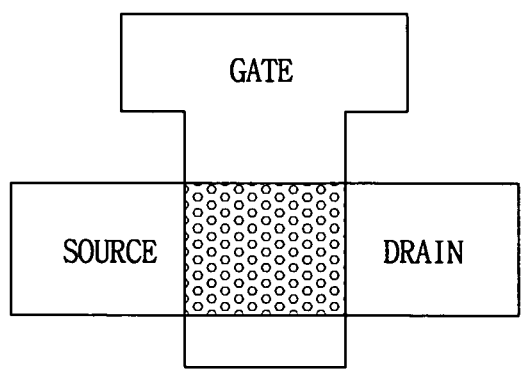

FIG. 14 illustrates an arrangement of a switching thin film transistor 120 and a driving thin film transistor 130 in pixel portion 20 of an organic electroluminescent device according to an embodiment of the present invention. Enlarged view A shows an arrangement of polycrystalline silicon grains formed in active channel regions of a driving thin film transistor, and enlarged view B shows an arrangement of polycrystalline silicon grains formed in active channel regions of switching thin film transistor.

Referring to FIG. 14, grains of polycrystalline silicon formed in active channel regions of a switching thin film transistor and a driving thin film transistor are formed in an isotropic shape. More grain boundaries may be included in the driving thin film transistor than in the switching thin film transistor if the size of grains of polycrystalline silicon formed in the driving thin film transistor illustrated in enlarged view A is larger than the size of grains of polycrystalline silicon formed in the switching thin film transistor illustrated in enlarged view B. Therefore, more grain boundaries meeting the current direction line may also be included in the driving thin film transistor than in the switching thin film transistor. The number of grain boundaries in the driving thin film transistor may be at least one or more larger than the number of grain boundaries in the switching thin film transistor. The switching thin film transistor and the driving thin film transistor of active channel regions of the thin film transistor have an equal length d. Isotropic shaped polycrystalline silicon in this embodiment may be formed by excimer laser annealing.

Figure 15:
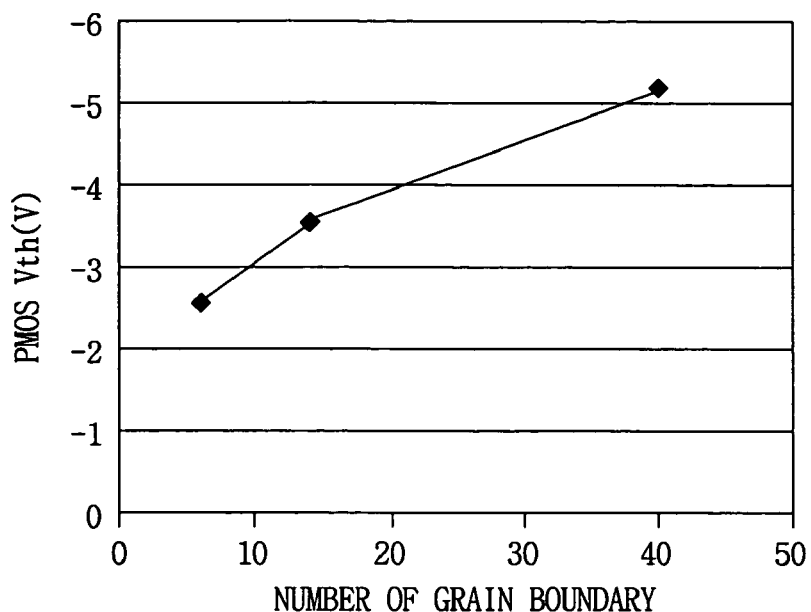
FIG. 15 is a graph illustrating a change of threshold voltage values according to the number of grain boundaries included in active channel regions of a thin film transistor according to an embodiment of the invention.
Figure 16:
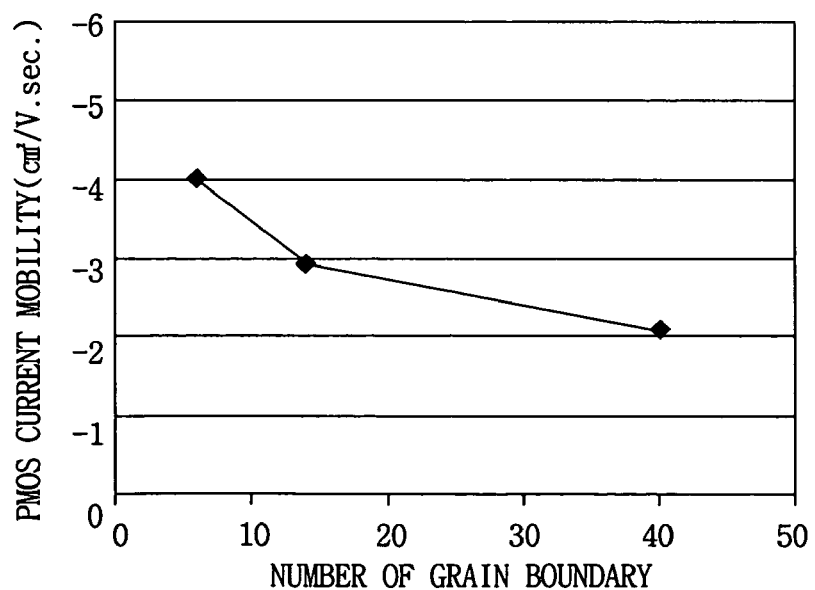
FIG. 16 is a graph illustrating a change of current mobility values according to the number of grain boundaries included in active channel regions of a thin film transistor according to an embodiment of the present invention.

FIG. 15 is a graph illustrating the change in threshold voltage values according to the number of grain boundaries included in active channel regions of a thin film transistor, and FIG. 16 is a graph illustrating the change in current mobility values according to the number of grain boundaries included in active channel regions of a thin film transistor.

Referring to FIG. 15 and FIG. 16, it can be seen that threshold voltage is increased, and current mobility is decreased as the number of grain boundaries meeting a current direction line is being increased.

Grain boundaries may effect electrical characteristics of thin film transistor, wherein the electrical characteristics of a thin film transistor may be influenced mainly by primary grain boundaries and additionally by side grain boundaries of anisotropic grains.

If the fabricated polycrystalline silicon is applied to TFT with one or more gates, the average number of grains included in an area of equal active channel regions may be at least one or more larger in the driving thin film transistor than in the switching thin film transistor, and the number of the grain boundaries included may also be larger in the driving thin film transistor than in the switching thin film transistor.

Furthermore, in active channel regions of a gate included in one TFT, the size of polycrystalline silicon grains formed in active channel regions of the driving thin film transistor may be more uniform than the size of polycrystalline silicon grains formed in active channel regions of the switching thin film transistor. The difference of the number (area) of grain boundaries due to the difference of the number of grains existing in active channels may be decreased as the area of grain boundaries covering the one grain is decreased while the number (area) of grain boundaries included in active channels may be increased when the size of the grains is small.

Furthermore, the average grain size of polycrystalline silicon grains included in active channel regions of each gate may be larger in the switching thin film transistor than in the driving thin film transistor.

Therefore, uniformity of current may be improved in the driving thin film transistor when compared to the switching thin film transistor as grain size is more uniform in the driving thin film transistor than in the switching thin film transistor, although current characteristics such as current mobility may be more improved in the switching thin film transistor when compared to the driving thin film transistor. In the present invention, a TFT may have two or more gates to accomplish these objects.

FIG. 17A to FIG. 17G are process charts sequentially illustrating processes for manufacturing CMOS thin film transistor used in an organic electroluminescent device according to an embodiment of the present invention.

Figure 17A:
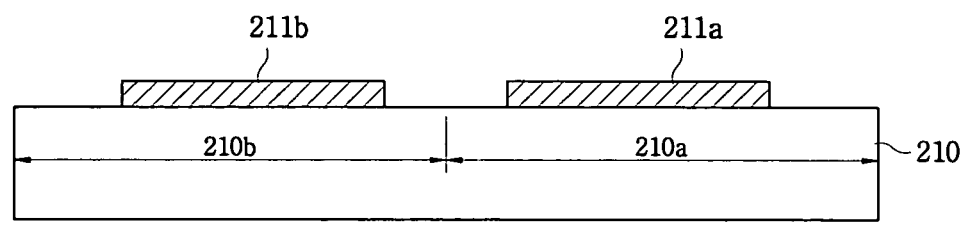
FIG. 17A to FIG. 17G are process charts sequentially illustrating processes for manufacturing CMOS thin film transistor according to an embodiment of the present invention.

As illustrated in FIG. 17A, polycrystalline silicon patterns 211a, 211b are respectively formed on the N type thin film transistor region 210a and P type thin film transistor region 210b by positioning a first mask (not shown on the drawing) on the substrate 210, thereby etching polycrystalline silicon film after depositing the polycrystalline silicon film on substrate 210 comprising N type thin film transistor region 210a and P type thin film transistor region 210b. Channel regions of N type thin film transistors may have the same width as channel regions of P type thin film transistor.

The number of grain boundaries may be adjusted in a case of forming polycrystalline silicon patterns 211a, 211b. In the present invention, the polycrystalline silicon film may be formed by crystallizing amorphous silicon on the polycrystalline silicon patterns using laser, and the polycrystalline silicon film may be formed by SLS method.

Grain boundaries may be formed when crystallizing amorphous silicon using laser, and the grain boundaries may have an effect on-current mobility and the threshold voltage of P type thin film transistors and N type thin film transistors in the case of device fabrication.

Therefore, the number of "primary" grain boundaries included in active channel regions of a P type thin film transistor and the number of "primary" grain boundaries included in active channel regions of an N type thin film transistor may be controlled in the present invention so that absolute value difference hardly exists between threshold voltage of N type thin film transistor and threshold voltage of P type thin film transistor.

In the present invention, the number of "primary" grain boundaries included in active channel regions of an N type thin film transistor may be at least one or more greater than the number of "primary" grain boundaries included in active channel regions of a P type thin film transistor. The number of "primary" grain boundaries included in P type thin film transistor may be two or less, and may be zero.

Amorphous silicon may be first crystallized by opening a mask and irradiating a laser onto the N type thin film transistor region only. Amorphous silicon may be crystallized by opening the mask and irradiating the laser onto a P type thin film transistor region only after moving the mask, since the number of "primary" grain boundaries included in a P type thin film transistor may be different from the number of "primary" grain boundaries included in an N type thin film transistor. Further, it may not matter that the N type thin film transistor is crystallized after the P type thin film transistor is crystallized.

Figure 17B:
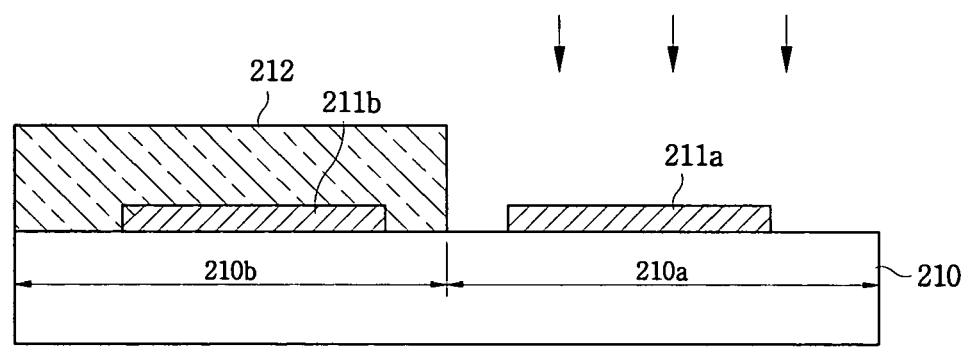

Channel doping may be performed with an N type dopant using patterned photoresist 212 as mask after exposing polycrystalline silicon patterns 211a of channel regions 210a of an N type thin film transistor to provide conductivity to the N type thin film transistor as illustrated in FIG. 17B after forming polycrystalline silicon patterns.

A flat panel display device may be constructed in an ordinary N type thin film transistor structure, lightly doped drain (LDD) structure or off-set structure, and it is not limited to a specific structure. However, the process for a CMOS thin film transistor having LDD structure is described as follows for convenience of description in the present embodiments of the invention.

Figure 17C:
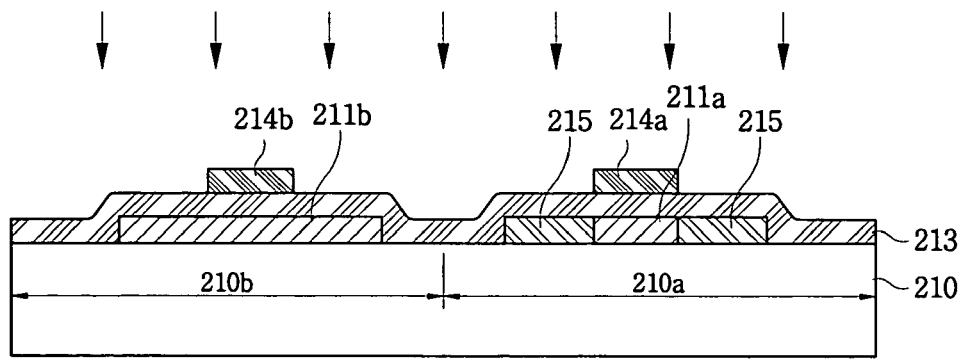

A gate electrode material may be deposited on the upper part of the gate insulation film 213 after removing photoresist 212 and forming gate insulation film 213 on the substrate 210 as illustrated in FIG. 17C. Gate electrodes 214a, 214b of an N type thin film transistor and a P type thin film transistor may be formed on the corresponding regions by etching the gate electrode material on the substrate 210 using a mask. Low concentration source/drain regions 215 may be formed at both sides of the gate electrode 214a by ion injecting N type low concentration impurities in polycrystalline silicon patterns 211a of the N type thin film transistor regions 210a in order to form a LDD structure.

Figure 17D:
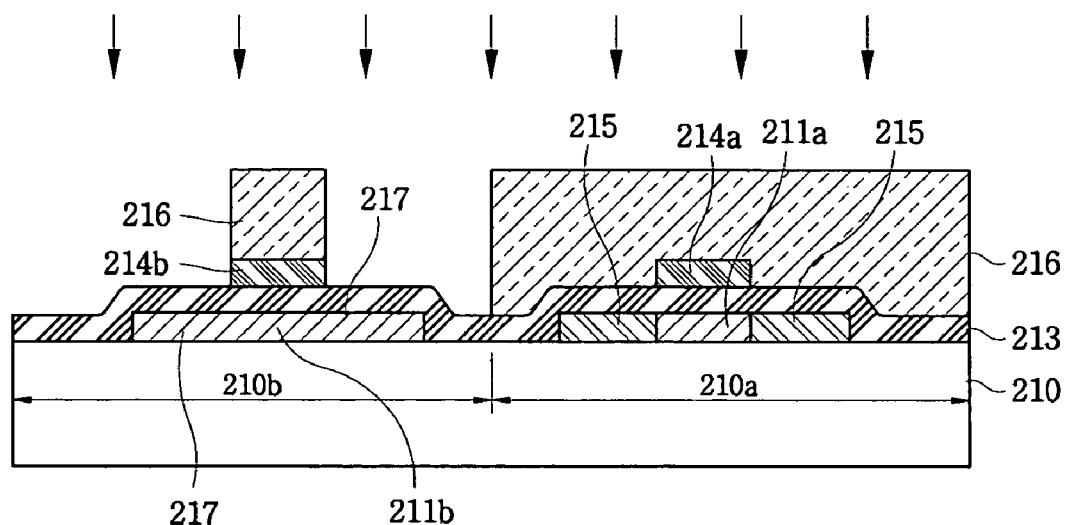

As illustrated in FIG. 17D, a mask for simultaneously preventing ion injection of impurities into the N type thin film transistor regions 210a and forming source/drain regions of P type thin film transistor may be formed by performing a photolithography process. High concentration source/drain regions 217 of a P type thin film transistor may be formed by ion injecting high concentration P type impurities into the polycrystalline silicon patterns 211b of P type thin film transistor regions 210b using the mask after coating a photoresist on the front surface of the low concentration source/drain region 215 formed substrate 210.

Figure 17E:
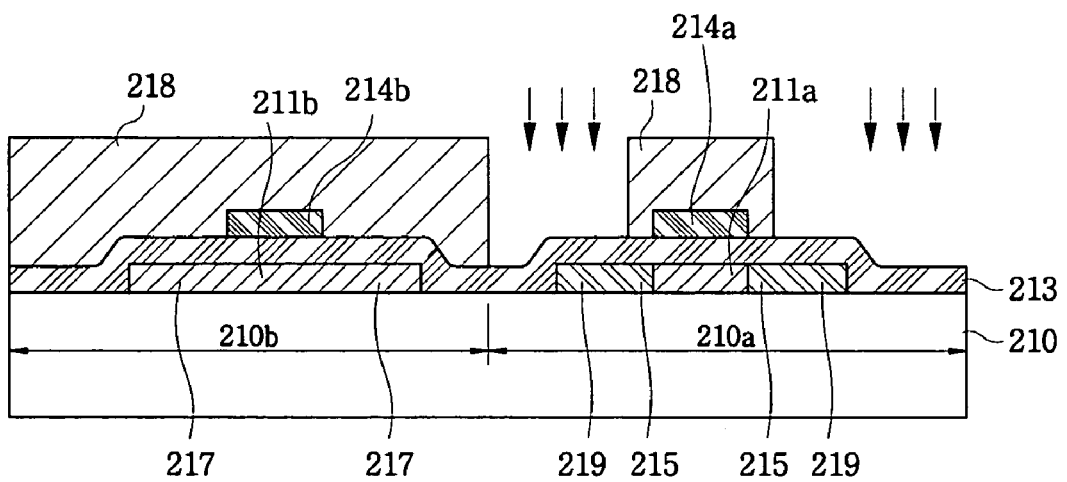

As illustrated in FIG. 17E, a mask 218 may be formed to prevent ion injection of impurities into the gate electrode of N type thin film transistor and P type thin film transistor regions 210b by performing a photolithography process after coating a photoresist on the substrate 210 again after removing the mask. High concentration source/drain regions 219 may be formed by ion injecting N type high concentration impurities into polycrystalline silicon patterns 211a of the N type thin film transistor regions 210a using the mask 218.

Figure 17F:
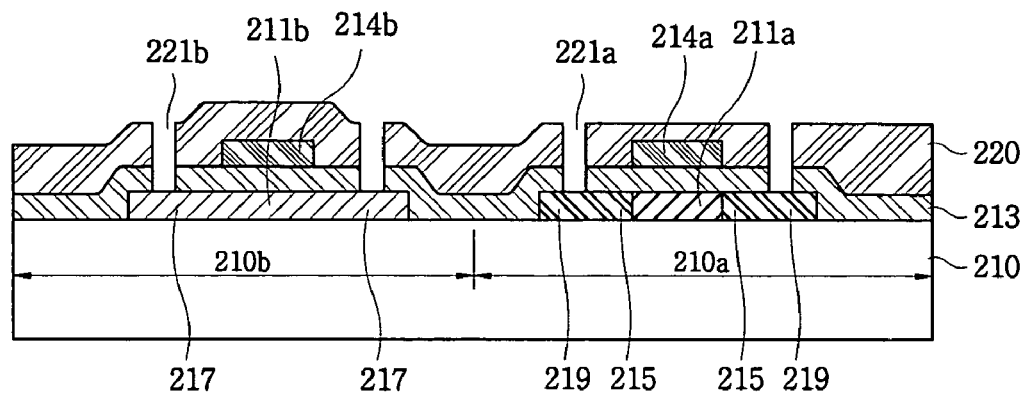

An interlayer insulation film 220 may be formed on the front surface of the substrate 210 after removing the mask 218, as illustrated in FIG. 17F. Contact holes 221a, 221b may be respectively formed on the N type thin film transistor regions 210a and P type thin film transistor regions 210b by etching the interlayer insulation film 220 to expose source/drain regions 217, 219 of N type thin film transistor and P type thin film transistor with the mask being positioned on the substrate 210.

Figure 17G:
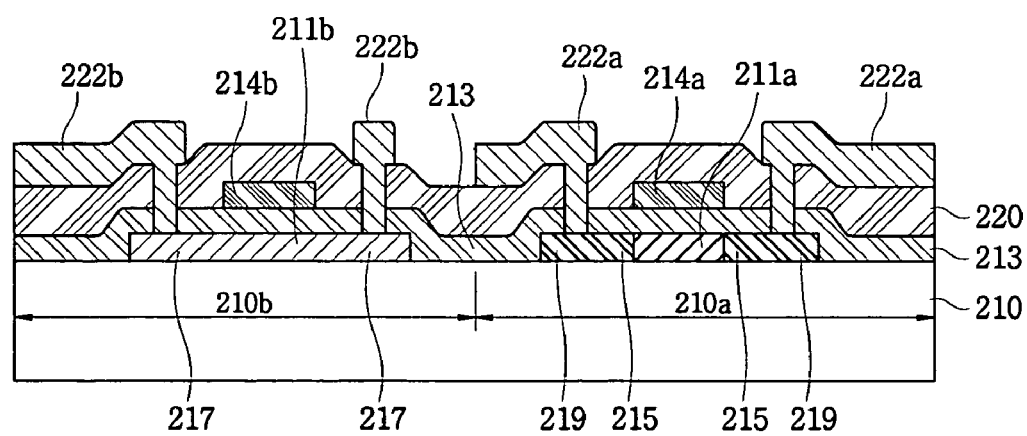

Source/drain electrodes 222a, 222b of N type thin film transistor and P type thin film transistor may be respectively formed by etching the conductive metallic material using a mask, after depositing a conductive metallic material for forming source/drain electrodes on the front surface of substrate 210, as illustrated in FIG. 17G.

A CMOS thin film transistor comprising an N type thin film transistor having an LDD structure and a P type thin film transistor having an ordinary structure may be fabricated accordingly.

Figure 18A:
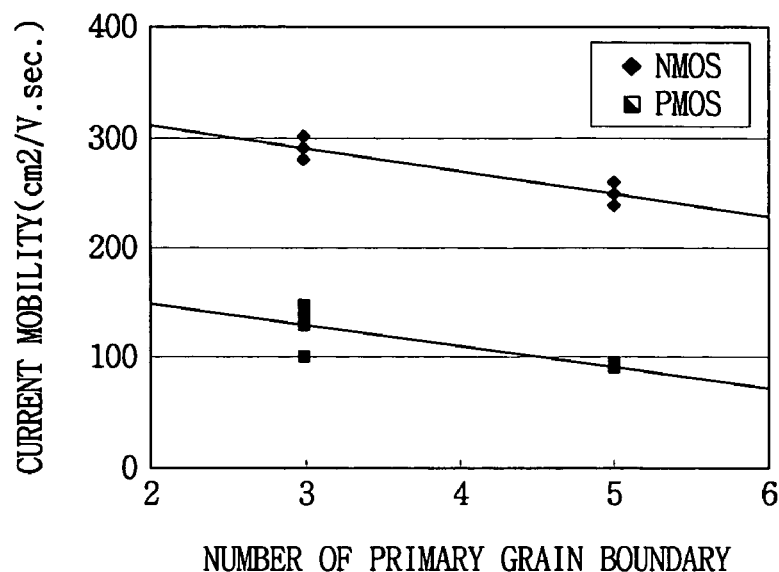
FIG. 18A and FIG. 18B are graphs illustrating a change of current mobility and threshold voltage according to the number of "primary" grain boundaries included in active channel regions of a P type thin film transistor and an N type thin film transistor having an LDD structure of FIG. 17G.
Figure 18B:
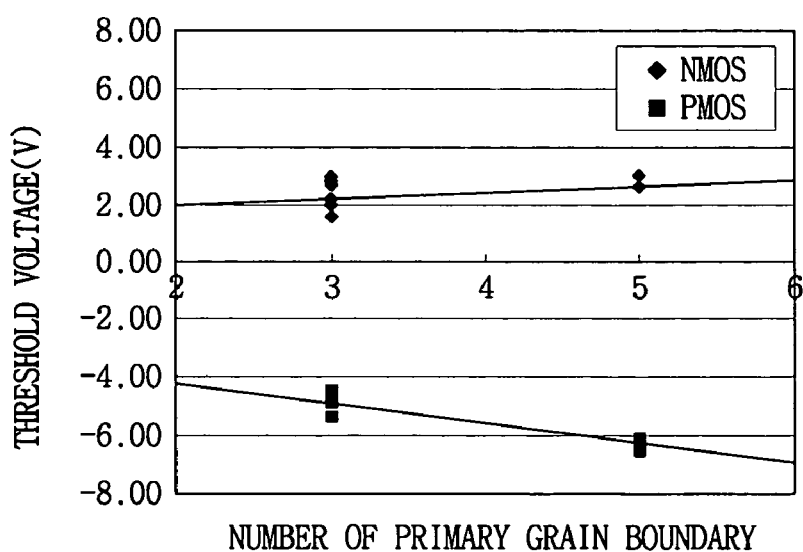

FIG. 18A and FIG. 18B are graphs illustrating a change of current mobility and a threshold voltage according to the number of "primary" grain boundaries included in active channel regions of a P type thin film transistor and an N type thin film transistor having an LDD structure of FIG. 17G.

As illustrated in FIG. 18A, the smaller the number of "primary" grain boundaries, the better the current mobility may be in the case of an N type thin film transistor and a P type thin film transistor. The N type thin film transistor may have superior current mobility than the P type thin film transistor if equal number of the "primary" grain boundaries is included in the N type thin film transistor and the P type thin film transistor when comparing the N type thin film transistor with the P type thin film transistor.

Furthermore, the less "primary" grain boundaries that are included in channel regions, the smaller an absolute value difference between the threshold voltage of an N type thin film transistor and the threshold voltage of a P type thin film transistor becomes. The P type thin film transistor may have a larger absolute threshold voltage value than the N type thin film transistor, as well as a larger absolute slope value of graph than the N type thin film transistor when equal "primary" grain boundaries are included as illustrated in FIG. 18B.

Fewer "primary" grain boundaries may be included in active channel regions of the N type thin film transistor than in active channel regions of the P type thin film transistor. The "primary" grain boundaries may be at least one or more less in active channel regions of the N type thin film transistor than in active channel regions of the P type thin film transistor.

Referring to FIG. 18B, there may be little threshold voltage difference between the P type thin film transistor and the N type thin film transistor since an absolute threshold voltage value may be 4 when the number of "primary" grain boundaries included in the P type thin film transistor is 2, while an absolute threshold voltage value may be about 3.5 when the number of "primary" grain boundaries included in the N type thin film transistor is 6.

A CMOS thin film transistor of the present invention in which the number of "primary" grain boundaries of polycrystalline silicon included in active channel regions of N type thin film transistor is larger than the number of "primary" grain boundaries of polycrystalline silicon included in active channel regions of P type thin film transistor may be used in an active element type LCD or an organic electroluminescent device when the CMOS thin film transistor is used in a display device.

Figure 19:
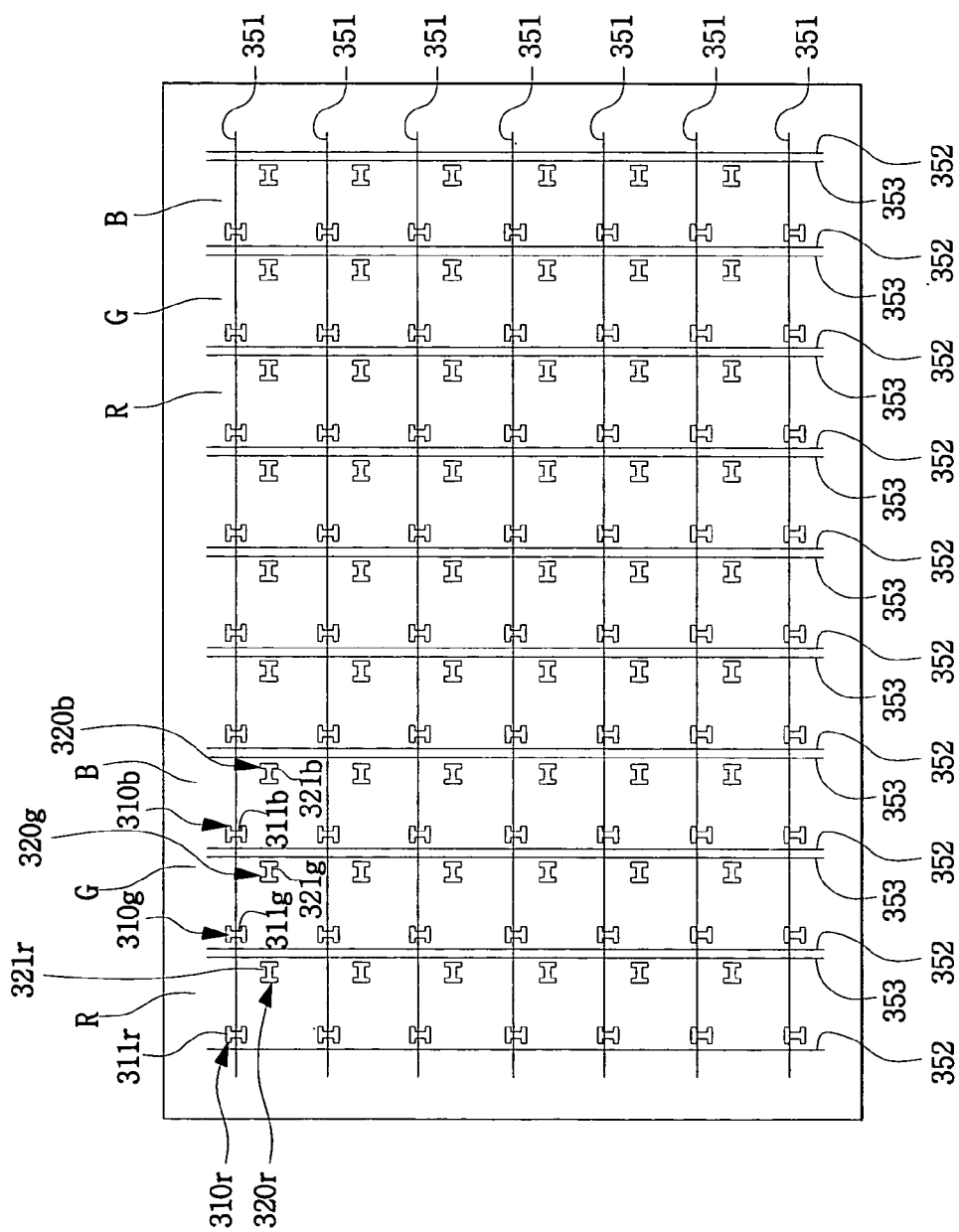
FIG. 19 illustrates structure of active regions of a thin film transistor of an active matrix organic electroluminescent device in a flat panel display device according to an embodiment of the present invention.

FIG. 19 is a plan drawing for explaining the structure of active regions of a thin film transistor of an active matrix organic electroluminescent device in a flat panel display device according to an embodiment of the present invention. Referring to FIG. 19, each pixel of the organic electroluminescent device may be installed in such a way that red (R), green (G) and blue (B) sub-pixels are repeatedly longitudinally (upwardly in FIG. 19) arranged. However, formation of these pixels is not necessarily limited to this formation. The sub-pixels of each color may be arranged in various patterns such as mosaic shape and lattice shape to form the pixels.

In the organic electroluminescent device, a plurality of gate lines 351 are laterally (horizontally in FIG. 19) arranged, and a plurality of data lines 352 and a plurality of driving lines 353 are longitudinally arranged. The gate lines 351, data lines 352 and driving lines 353 are installed in such a way that they surround one sub-pixel.

In the foregoing formation, each sub-pixel of red (R), green (G) and blue (B) pixels comprise at least two thin film transistors, wherein the first thin film transistor becomes a switching thin film transistor for controlling operation of the device according to the signals of the gate lines 351, and the second thin film transistor becomes driving thin film transistor for driving the device. The number, arrangement and arrangement method of the thin film transistors may vary according to characteristics and driving method of display.

As in the foregoing organic electroluminescent display device, respective red, green and blue pixels may have different luminance, as the emitting layer of the pixels has different emission efficiency, and white balance is not adjusted for the same current value. Current values required to be flow to the respective red, green and blue sub-pixels to satisfy efficiency and white balance of red, green and blue organic emitting layers currently generally widely used in an organic electroluminescent display device are represented in Table 1.

TABLE 1

|  | Red | Green | Blue |
| --- | --- | --- | --- |
| Efficiency (Cd/A) | 6.72 | 23.37 | 4.21 |
| Indicating pixel current (□) | 0.276 | 0.079 | 0.230 |
| Indicating pixel current ratio | 3.5 | 1 | 2.9 |

It can be seen in Table 1 that the current values flowing to the sub-pixels to adjust the white balance may be increased in the order of green sub-pixel, blue sub-pixel and red sub-pixel. Alternative orders may also be used.

Polycrystalline silicon may be used in the present invention as a semiconductor layer for forming a transistor. Therefore, in active channel regions of a second thin film transistor used as a driving thin film transistor in the present invention, different numbers of primary grain boundaries are included in an equal size of the active channel regions per respective red, green and blue indicating pixel so that the white balance may be adjusted for the same driving voltage.

Figure 20:
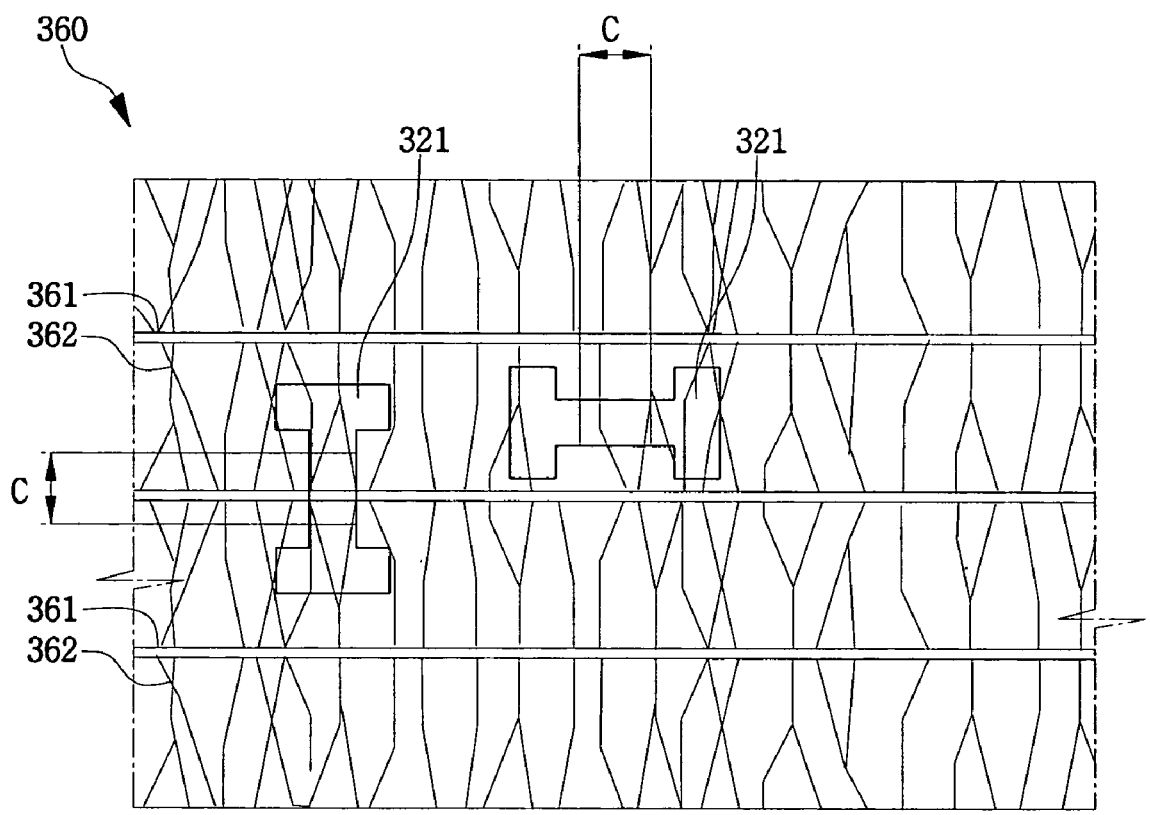
FIG. 20 illustrates a structure in which a thin film transistor is arranged on polycrystalline silicon according to an embodiment of the present invention.

FIG. 20 illustrates a structure in which a thin film transistor may be arranged on polycrystalline silicon. Although polycrystalline silicon may be formed by crystallizing amorphous silicon thin film using an ordinary SLS method, the foregoing crystal structure is not necessarily limited to a crystal structure formed by the SLS method. Any crystallization method can be applied. Laser crystallization method may be used if the polycrystalline silicon thin film has a crystal structure similar to a structure illustrated in FIG. 20.

Figure 21:
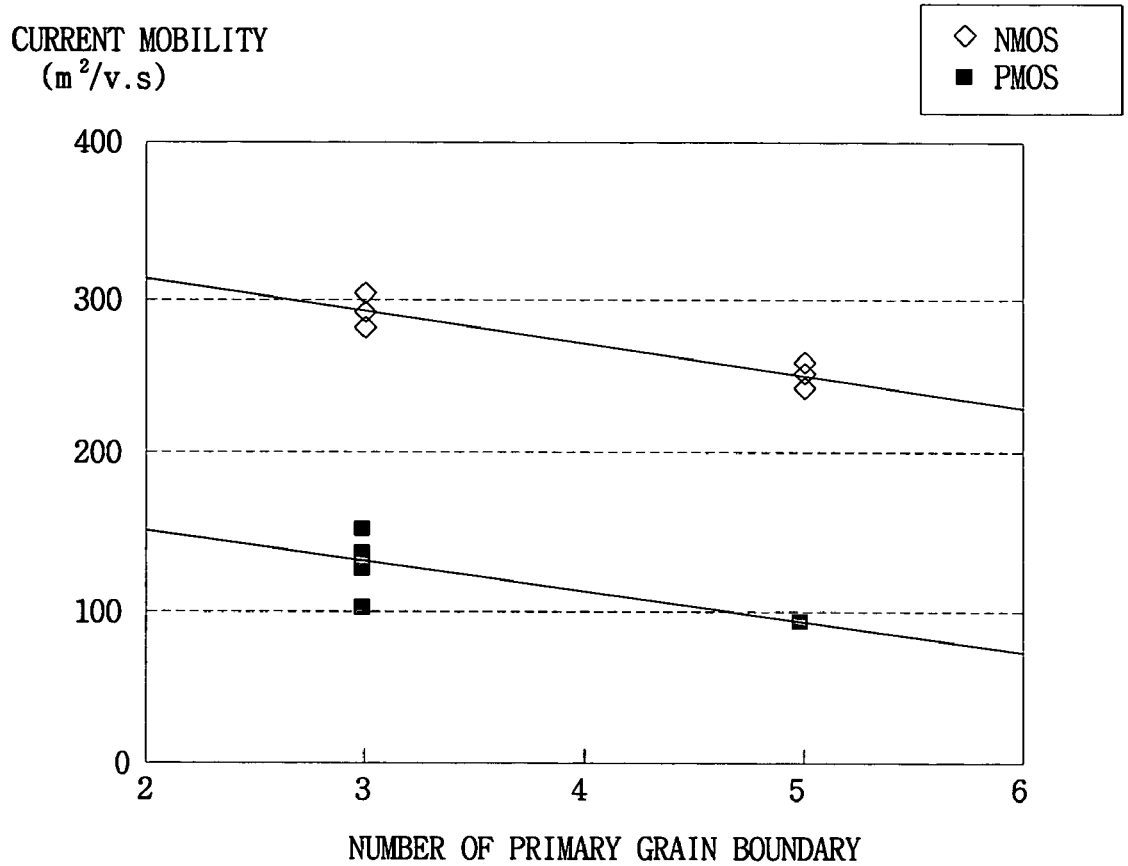
FIG. 21 is a graph illustrating a change in current mobility according to the number of primary grain boundaries according to an embodiment of the present invention.

FIG. 21 is a graph illustrating a change in current mobility according to the number of primary grain boundaries. Referring to FIG. 21, current mobility of a PMOS thin film transistor or an NMOS thin film transistor may be linearly reduced as the number of primary grain boundaries is being increased.

Figure 22:
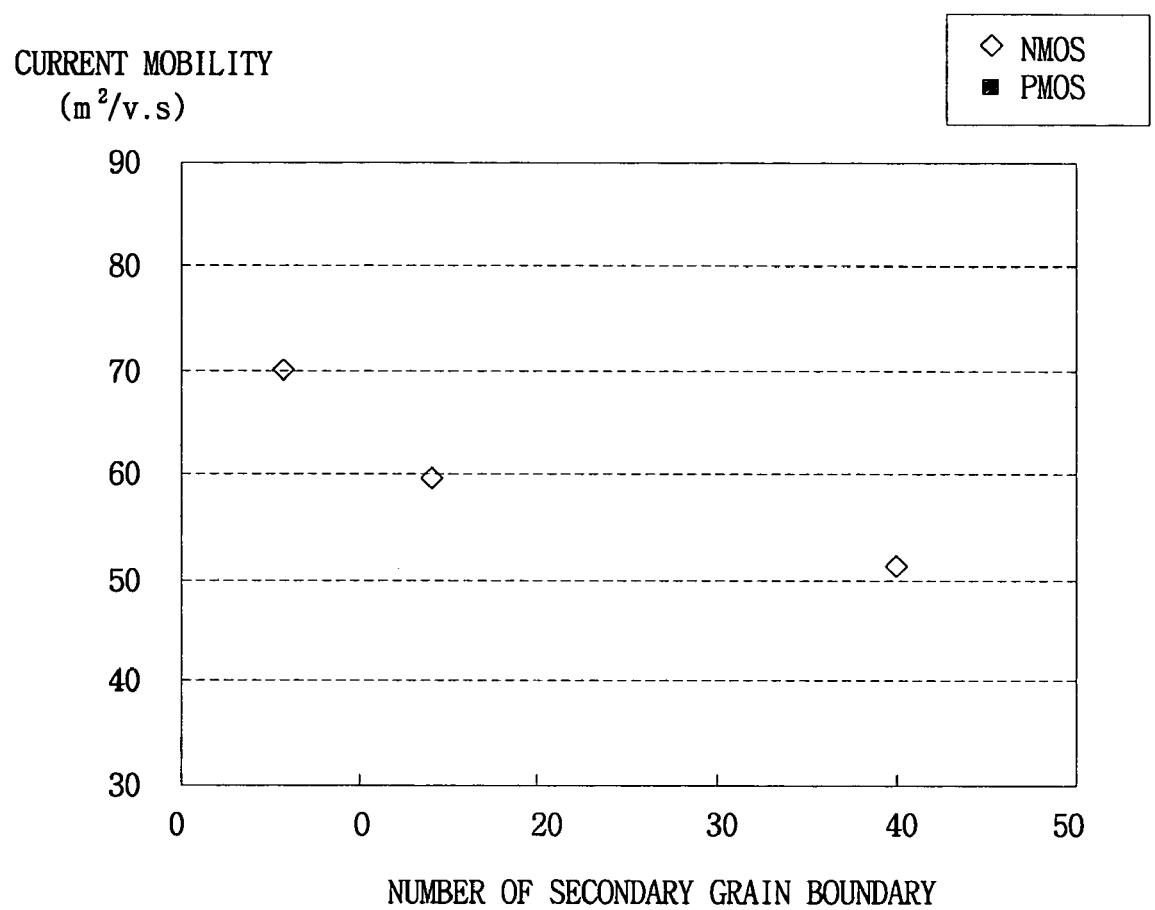
FIG. 22 is a graph illustrating a change in current mobility according to the number of side grain boundaries of anisotropic grains according to an embodiment of the present invention.

FIG. 22 is a graph illustrating change of current mobility according to the number of side grain boundaries of anisotropic grains. Current mobility of a PMOS thin film transistor or an NMOS thin film transistor may also be reduced as the number of side grain boundaries of anisotropic grains is being increased.

Current mobility characteristics may be improved compared to when the primary grain boundaries are parallel to the direction of current flowing from the source to the drain, since primary grain boundaries may have more effect on the number of grain boundaries capable of functioning as trap for current flow than side grain boundaries of anisotropic grains.

Uniformity of a TFT may be secured, since variations for position change inside the substrate of active channels is less (e.g., variation changes when the number of grain boundaries is changed from one to two and when the number of grain boundaries is changed from 100 to 102), while current characteristics may degrade due to an increase in the number of grain boundaries. A trap may result when the electric charge carrier traverses one or more of the grain boundaries (e.g., side grain boundaries of anisotropic grains), in case that "primary" grain boundaries are parallel to current direction.

Side grain boundaries of anisotropic grains may have small variations according to the current movement in accordance with the change in the number of grain boundaries, although "primary" grain boundaries may have large variations according to current movement in accordance with the change of the number of grain boundaries.

Therefore, this current value difference in the present invention may be accomplished by changing the number of primary grain boundaries and/or the number of side grain boundaries of anisotropic grains of polycrystalline silicon included in active channel regions of the second thin film transistor of FIG. 19, e.g., a driving thin film transistor for supplying current to emission device. A current value supplied to the emission device of each sub-pixel, for example, an organic electroluminescent device, may be changed by changing the number of primary grain boundaries included in active channel regions of a first thin film transistor of red, green and blue sub-pixels.

The number of primary grain boundaries included in active channels of the second thin film transistor may be determined by a current value flowing to each sub-pixel at the same driving voltage. Therefore, the number of primary grain boundaries included in active channel regions of the second thin film transistor of the green sub-pixels may be controlled to the minimum in such a way that the current value of the green sub-pixels having the highest luminance becomes the lowest to adjust white balance. Alternatively, the number of primary grain boundaries included in each active channel region of the second red thin film transistor, the second blue thin film transistor and the second green thin film transistor may be controlled in such a way that the current value for each sub-pixel is lowered in the order of red, blue and green sub-pixels. Therefore, luminance of each sub-pixel may be complemented so that the white balance is adjusted accordingly.

The number of primary grain boundaries included in active channel regions of the second thin film transistor may also be determined by the electric charge mobility of the active channel regions, since more current flows if the electric charge mobility in the active channel regions is higher while less of current flows if the electric charge mobility in the active channel regions is lower.

Therefore, the number of primary grain boundaries included in active channel regions of a second thin film transistor of a green sub-pixel may be controlled in such a way that the electric charge mobility of the green sub-pixel having the highest emission efficiency is lowered to the minimum to adjust the white balance. The number of primary grain boundaries included in active channel regions of the second thin film transistor of each sub-pixel may be controlled in such a way that the number of primary grain boundaries is increased in the order of red, blue and green sub-pixels, or the number of primary grain boundaries may be equivalent to each other in the blue and green sub-pixels.

The number of the primary grain boundaries may be increased in the order of primary grain boundaries included in active channel regions of a second thin film transistor of the red sub-pixel, primary grain boundaries included in active channel regions of a second thin film transistor of the blue sub-pixel and primary grain boundaries included in active channel regions of a second thin film transistor of the green sub-pixel, so that the active channel regions of the second thin film transistor of the red sub-pixel has the highest electric charge mobility.

Accordingly, the respective sub-pixels have different current values as mentioned above so that luminance of each sub-pixel is supplemented to adjust white balance. Furthermore, the number of grain boundaries included in active channel regions of the second thin film transistor varies according to the emitting material for forming the emitting layer, and the number of grain boundaries included in active channel regions of the second thin film transistor of each sub-pixel may be set based on the green sub-pixel after obtaining the luminance of each pixel and current ratio for adjusting the white balance in advance.

Structure and fabrication method for an organic electroluminescent device according to an embodiment of the present invention are described as follows referring to FIG. 23, FIG. 24 and FIG. 25.

Figure 23:
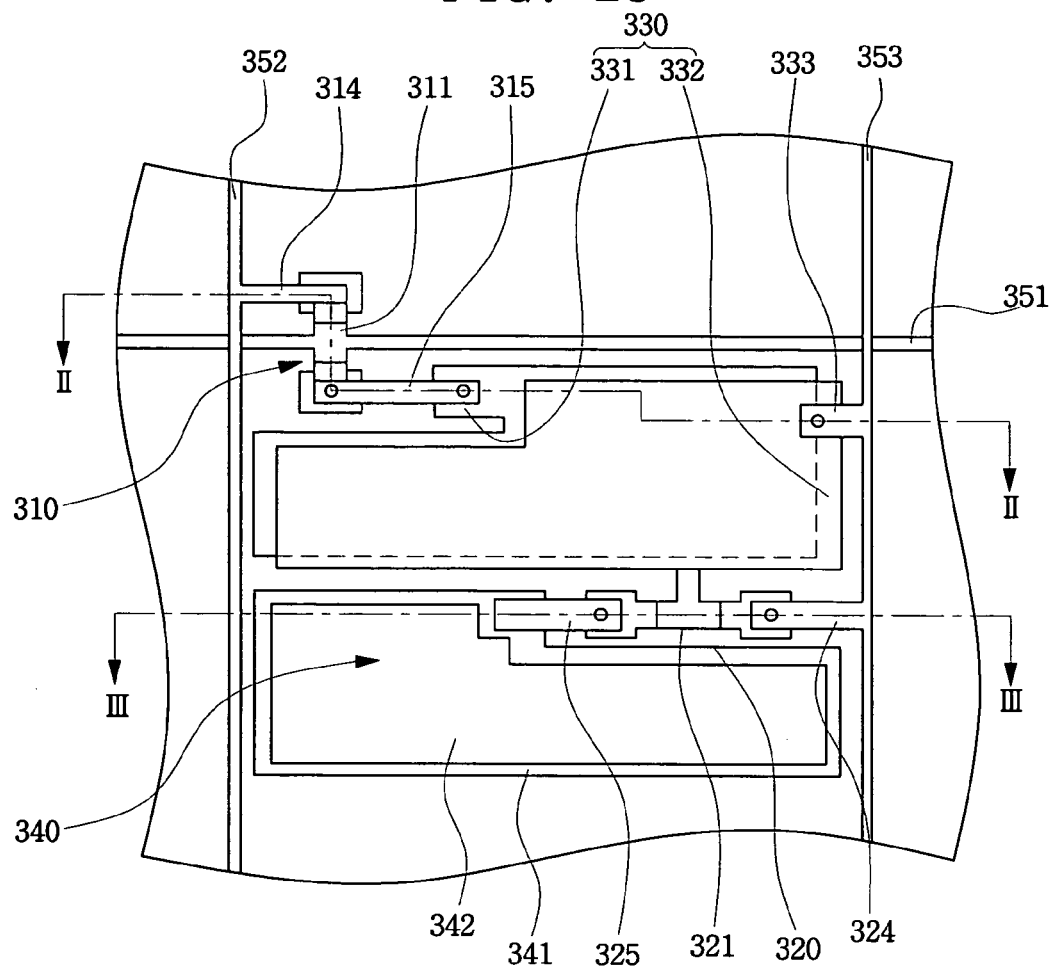
FIG. 23 is a partially enlarged plan drawing illustrating a single pixel in FIG. 19.

FIG. 23 is a partially enlarged plan figure illustrating a single pixel of FIG. 19. FIG. 24 is a cross sectional view illustrating a cross section cut along a line II-II in FIG. 23. FIG. 25 is a cross sectional view illustrating a cross section cut along a line III-III in FIG. 23.

Figure 24:
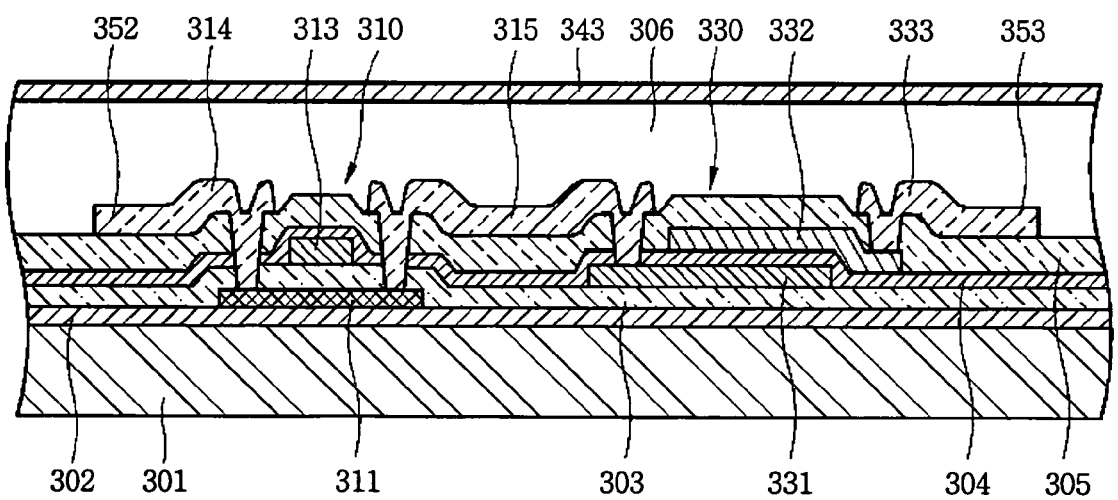
FIG. 24 is a cross sectional view illustrating a cross section cut along a line II-II in FIG. 23.
Figure 25:
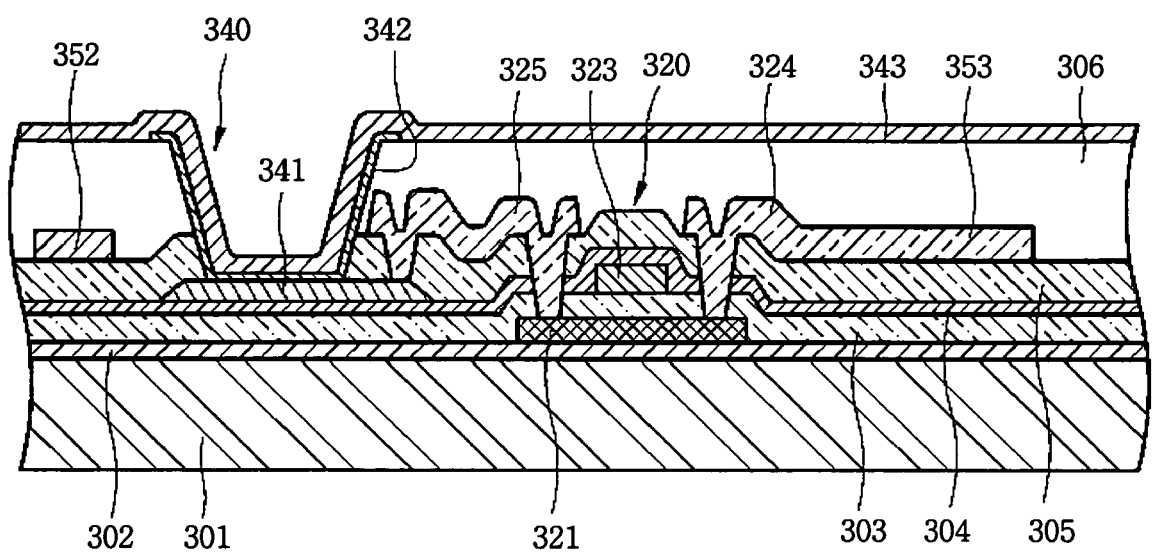
FIG. 25 is a cross sectional view illustrating a cross section cut along a line III-III in FIG. 23.

As shown in FIG. 23, FIG. 24 and FIG. 25, a buffer layer 302 is formed on an insulation substrate 301 made of a glass material, and first thin film transistor 310, second thin film transistor 320, capacitor 330 and organic electroluminescent device 340 are formed on the upper part of the buffer layer 302. The buffer layer 302 can be formed of $SiO_2$ and deposited by PECVD, APCVD, LPCVD and/or ECR. The buffer layer 302 may be deposited to a thickness of approximately 3,000 Å.

An amorphous silicon thin film may be deposited on the upper part of the buffer layer 302 to a thickness of approximately 500 Å. The amorphous silicon thin film can be crystallized into polycrystalline silicon thin film by various methods, wherein the crystallized polycrystalline silicon thin film comprises primary grain boundaries longitudinally extended, and side grain boundaries of anisotropic grains perpendicular to the primary grain boundaries as shown in FIG. 20. Although SLS method is used to obtain the foregoing crystal structure in an embodiment of the present invention, any crystallization method capable of obtaining this crystal structure may also be used.

The polycrystalline silicon thin film may be crystallized for each pixel, with mask patterns being changed to control the number of grain boundaries included in each pixel. That is, a superposition ratio in which mask patterns are superposed so that many grain boundaries are included in active channel regions of a driving thin film transistor may be lowered to lower the current value and current mobility in the case of a green pixel region. On the other hand, crystallization is performed through irradiation of the laser beam with mask patterns having as high a superposition ratio as possible to reduce the number of grain boundaries included in active channel regions of a driving thin film transistor in the case of a red region having low luminance efficiency.

The grain boundaries comprise both primary grain boundaries and side grain boundaries of anisotropic grains.

Polycrystalline silicon thin film may be formed in such a way that the number of grain boundaries included in active channel regions of a driving thin film transistor is changed by changing the superposition ratio of the mask patterns for each pixel.

The active channel regions of the second thin film transistor may be patterned so that active channel regions of the second thin film transistor for each sub-pixel are perpendicular to the direction of the grain boundaries, as shown in FIG. 19, after forming the polycrystalline silicon thin film, wherein the grain boundaries are primary grain boundaries and/or side grain boundaries of anisotropic grains, and active channel regions of the first thin film transistor are also patterned at the same time.

A gate insulation film may be formed by depositing $SiO_2$ on the patterned active channel regions by a PECVD, APCVD, LPCVD and/or ECR method after patterning the active channel regions. A gate electrode may be formed by patterning the conductive film after forming a conductive film on the gate insulation film using MoW, Al/Cu, etc. The active channel regions, gate insulation film and gate electrode may be patterned by various sequences and methods.

N type or P type impurities may be doped on source and drain regions of the active channel regions, gate insulation film and gate electrode after patterning the active channel regions, gate insulation film and gate electrode.

Source electrodes 314, 324 and drain electrodes 315, 325 are connected to active channel regions 311, 321 through contact holes, and planarization film 306 may be formed after forming interlayer insulation film 304 and passivation film 305 as shown in FIG. 24 and FIG. 25 after finishing the doping process. These films may adopt various structures according to device design.

On the other hand, EL device 340 connected to second thin film transistor may be formed by various methods, wherein the anode electrode 341 is patterned and an organic film 342 is formed on the patterned anode electrode after first forming an anode electrode 341 connected to the drain electrode 325 of the second thin film transistor 320 by ITO. A low molecular or high molecular organic film may be used as the organic film 342, wherein when of using the low molecular organic film, a hole injection layer, a hole transport layer, an organic emitting layer, an electron transport layer and an electron injection layer may be formed or laminated in a single or composite structure. An organic material used in the low molecular organic film may include copper phthalocyanine (CuPc), N,N'-di(naphthalene-1-yl)-N,N'-diphenyl-benzidine (NPB) and/or tris-8-hydroxyquinoline aluminum (Alq3). The low molecular organic film may be formed by vacuum deposition method.

The high molecular organic film may have a structure having a hole transport layer (HTL) and an emitting layer (EML), wherein a PEDOT is used as the hole transport layer, a high molecular organic material such as a PPV (polyphenylenevinylene) series and a polyfluorene is used as the emitting layer, and the hole transport layer and the emitting layer are formed by screen printing or inkjet printing method A cathode electrode 343 may be formed by depositing Al/Ca on the front surface of the organic film or patterning the organic film using Al/Ca after forming the organic film. The upper part of the cathode electrode 343 may be sealed by glass or metal cap.

Although the present invention is applied to an organic electroluminescent device in the above description, the present invention is not limited to the organic electroluminescent device. The present invention may be applied to any structure using thin film transistor such as a liquid crystal display device or an inorganic electroluminescent device.

Furthermore, lamella structure of an organic electroluminescent device according to embodiments of the present invention may not necessarily be limited to the above description. However, the present invention can also be applied to other structures.

As described in the above, a flat panel display device comprising a polycrystalline silicon thin film transistor of the present invention may satisfy the electrical characteristics required in the flat panel display device by changing laser energy irradiated on a driving circuit portion and a pixel portion during crystallization of amorphous silicon, thereby changing the size of grains of polycrystalline silicon included in active channel regions having the same area.

Furthermore, a flat panel display device comprising a polycrystalline silicon thin film transistor of the present invention may satisfy the electrical characteristics required in the flat panel display device by changing the number of grain boundaries of polycrystalline silicon included in active channel regions having the same area in a switching thin film transistor and a driving thin film transistor at a pixel portion when crystallizing amorphous silicon.

Furthermore, the present invention may provide a CMOS thin film transistor having improved electrical characteristics by changing the number of "primary" grain boundaries in active channel regions of an N type thin film transistor and a P type thin film transistor included in the CMOS thin film transistor, thereby controlling threshold voltage absolute value and current mobility.

Furthermore, the present invention may adjust white balance, supplying proper current for each sub-pixel to obtain proper luminance and prevent deterioration of the life cycle by having equal sized active channel regions without changing of the width or size of active channel regions of a driving thin film transistor for driving pixels, and without changing of driving voltage.

Furthermore, the present invention may solve a reduction problem of an opening ratio and improving reliability by avoiding increasing an area taken by driving a thin film transistor per each pixel, but by controlling only an amount of current flowing to a device.

While the invention has been particularly shown and described with reference to exemplary embodiments thereof, it will be understood by those skilled in the art that the foregoing and other changes in form and details may be made therein without departing from the spirit and scope of the invention.

What is claimed is:

1. A flat panel display device with polycrystalline silicon thin film transistors, comprising:
   a pixel portion divided by gate lines and data lines and comprising thin film transistors driven by signals applied by the gate lines and data lines; and
   a driving circuit portion comprising thin film transistors connected to the gate lines and data lines respectively to apply signals to the pixel portion,
   wherein an average number of grain boundaries of polycrystalline silicon formed in an active channel region of each thin film transistor installed at the driving circuit portion and meet a current direction line is at least one or more less than an average number of grain boundaries of polycrystalline silicon formed in an active channel region of each thin film transistor installed at the pixel portion and meet a current direction line for a unit area of active channels,
   wherein the polycrystalline silicon grain boundaries formed in the active channel region of each thin film transistor installed at the driving circuit portion include primary polycrystalline silicon grain boundaries that are inclined to the current direction line at an angle of about −45 to 45°,
   wherein the polycrystalline silicon grain boundaries formed in the active channel region of each thin film transistor installed at the pixel portion include primary polycrystalline silicon grain boundaries that are inclined to the current direction line at an angle of about −45 to 45°, and
   wherein the active channel of each thin film transistor installed at the pixel portion is longer than the active channel of each thin film transistor installed at the driving circuit portion.

2. The flat panel display device with polycrystalline silicon thin film transistor according to claim 1, wherein a shape of the grains of polycrystalline silicon is anisotropic, and the grain boundaries are primary grain boundaries.

3. The flat panel display device with polycrystalline silicon thin film transistor according to claim 2, wherein the polycrystalline silicon is fabricated by a sequential lateral solidification method.

4. The flat panel display device with polycrystalline silicon thin film transistors according to claim 1, wherein a shape of the grains of polycrystalline silicon is an isotropic, and the grain boundaries include side grain boundaries of anisotropic grains.

5. The flat panel display device with polycrystalline silicon thin film transistors according to claim 4, wherein the polycrystalline silicon is fabricated by a metal induced lateral crystallization method.

6. The flat panel display device with polycrystalline silicon thin film transistors according to claim 1, wherein the flat panel display device is one of an organic electroluminescent device and a liquid crystal display device.

* * * * *